US012581006B2

(12) United States Patent
Kim et al.

(10) Patent No.: US 12,581,006 B2
(45) Date of Patent: Mar. 17, 2026

(54) WIRELESS MODULE AND ELECTRONIC DEVICE INCLUDING THE SAME

(71) Applicant: SAMSUNG ELECTRONICS CO., LTD., Suwon-si (KR)

(72) Inventors: Youngsub Kim, Suwon-si (KR); Jungho Park, Suwon-si (KR); Kwanghyun Baek, Suwon-si (KR); Jungyub Lee, Suwon-si (KR); Juneseok Lee, Suwon-si (KR); Dohyuk Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 345 days.

(21) Appl. No.: 18/313,722

(22) Filed: May 8, 2023

(65) Prior Publication Data

US 2024/0056520 A1 Feb. 15, 2024

Related U.S. Application Data

(63) Continuation of application No. PCT/KR2023/005834, filed on Apr. 27, 2023.

(51) Int. Cl.
H04M 1/02 (2006.01)
H05K 1/02 (2006.01)
H05K 1/14 (2006.01)

(52) U.S. Cl.
CPC .......... H04M 1/0277 (2013.01); H05K 1/028 (2013.01); H05K 1/144 (2013.01);
(Continued)

(58) Field of Classification Search
CPC .... H04M 1/0277; H04M 1/026; H05K 1/028; H05K 1/144; H05K 2201/041;
(Continued)

(56) References Cited

U.S. PATENT DOCUMENTS 9,831,557 B2 11/2017 Park et al.
9,966,666 B2 5/2018 Kim et al.
(Continued)

FOREIGN PATENT DOCUMENTS

CN 113690600 A 11/2021
CN 113764861 A 12/2021
(Continued)

OTHER PUBLICATIONS

Machine Translation of Kr-101766216B provided by the applicant.*
(Continued)

*Primary Examiner* — Amr A Awad
(74) *Attorney, Agent, or Firm* — Nixon & Vanderhye P.C.

(57) ABSTRACT

In various embodiments, a module for a wireless communication includes: a radiator, a plurality of resonators, a first substrate on which the radiator and the plurality of resonators are disposed, and a second substrate including a power supply. The first substrate includes a plurality of first layers. The second substrate includes a plurality of second layers. The radiator is disposed on a radiation layer of the plurality of first layers of the first substrate. The plurality of resonators is disposed on a resonance layer of the plurality of first layers of the first substrate. At least part of the plurality of resonators in the resonance layer is disposed in an area in the radiation layer, different from an area in which the radiator is disposed.

18 Claims, 23 Drawing Sheets

(52) U.S. Cl.
CPC .................. *H05K 2201/041* (2013.01); *H05K 2201/10098* (2013.01); *H05K 2201/10734* (2013.01)

(58) Field of Classification Search
CPC .......... H05K 2201/10098; H05K 2201/10734; H05K 1/0243; H05K 3/4644; H01Q 1/24; H01Q 1/246; H01Q 1/38; H01Q 1/42; H01Q 1/46; H01Q 5/385; H01Q 5/42; H01Q 15/006; H01Q 19/005; H01Q 21/065; H01Q 21/26; H01Q 1/243
See application file for complete search history.

(56) References Cited

U.S. PATENT DOCUMENTS

| | | | |
|---|---|---|---|
| 10,297,927 B2 | 5/2019 | Amadjikpe | |
| 11,271,309 B2 | 3/2022 | Miers et al. | |
| 2010/0090903 A1* | 4/2010 | Byun ................... | H01Q 9/0414 |
| | | | 343/700 MS |
| 2012/0119969 A1 | 5/2012 | Macdonald et al. | |
| 2020/0303805 A1 | 9/2020 | Ryoo et al. | |
| 2020/0381831 A1 | 12/2020 | Milroy et al. | |
| 2020/0412021 A1 | 12/2020 | Chang et al. | |
| 2020/0412022 A1 | 12/2020 | Yun et al. | |
| 2021/0249789 A1 | 8/2021 | Long et al. | |

| | | | |
|---|---|---|---|
| 2021/0344120 A1 | 11/2021 | Baek et al. | |
| 2023/0035473 A1* | 2/2023 | Li .......................... | H01Q 1/002 |
| 2023/0335898 A1* | 10/2023 | Koyama ............... | H01Q 23/00 |
| 2024/0120642 A1 | 4/2024 | Park et al. | |

FOREIGN PATENT DOCUMENTS

| | | |
|---|---|---|
| KR | 10-2008-0051435 | 6/2008 |
| KR | 10-0917847 | 9/2009 |
| KR | 101367259 B1 | 2/2014 |
| KR | 10-1411442 | 7/2014 |
| KR | 101698131 B1 | 1/2017 |
| KR | 10-1766216 | 8/2017 |
| KR | 10-2017491 | 9/2019 |
| KR | 10-2021-0011484 | 2/2021 |
| KR | 102323334 B1 | 11/2021 |
| KR | 10-2414772 | 6/2022 |
| KR | 20220111518 A | 8/2022 |
| WO | 2021/128182 | 7/2021 |

OTHER PUBLICATIONS

Search Report and Written Opinion dated Aug. 4, 2023 issued in International Patent Application No. PCT/KR2023/005834.
Extended European Search Report dated Sep. 29, 2025 for EP Application No. 23852677.6.

* cited by examiner

900

910
920

1100

1120

(1123)

1140

(1143)

WIRELESS MODULE AND ELECTRONIC DEVICE INCLUDING THE SAME

CROSS-REFERENCE TO RELATED APPLICATIONS

This application is a continuation of International Application No. PCT/KR2023/005834 designating the United States, filed on Apr. 27, 2023, in the Korean Intellectual Property Receiving Office and claiming priority to Korean Patent Application No. 10-2022-0100266, filed on Aug. 10, 2022, in the Korean Intellectual Property Office, the disclosures of which are incorporated by reference herein in their entireties.

BACKGROUND

Field

The disclosure relates to an antenna module and an electronic device including the same.

Description of Related Art

As one of the technologies for mitigating radio wave path loss and increasing a transmission distance of radio waves, beamforming technology is being used. Beamforming generally concentrates a reach area of the radio waves using multiple antennas or increases the directivity of reception sensitivity in a specific direction. Products equipped with the multiple antennas are being developed to increase communication performance, and it is expected that equipment having a much larger number of antennas will be increasingly used.

SUMMARY

According to an example embodiment, a module for a wireless communication may comprise: a radiator, a plurality of resonators, a first substrate on which the radiator and the plurality of resonators are disposed, and a second substrate including a power supply. The first substrate may include a plurality of first layers. The second substrate may include a plurality of second layers. The radiator may be disposed on a radiation layer of the plurality of first layers of the first substrate. The plurality of resonators may be disposed on a resonance layer of the plurality of first layers of the first substrate. At least a portion of the plurality of resonators in the resonance layer may be disposed in an area in the radiation layer, different (i.e., distinct) from an area in which the radiator is disposed.

According to an example embodiment, an electronic device in a wireless communication system, may comprise: a radome cover, a radio unit (RU) housing, and a RU module comprising at least one antenna. The RU module may comprise an RU board comprising an antenna board on which antenna modules comprising at least one antenna are disposed and a power supply. An antenna module of the antenna modules may comprise: a plurality of radiators, a plurality of resonators, and an antenna board on which the radiator and the plurality of resonators are disposed. The antenna board may include a plurality of first layers. The RU board may include a plurality of second layers. The radiator may be disposed on a radiation layer of the plurality of first layers of the antenna board. The plurality of resonators may be disposed on a resonance layer of the plurality of first layers of the antenna board. At least a portion of the plurality of resonators in the resonance layer may be disposed in an area in the radiation layer, different (i.e., distinct) from an area in which the radiator is disposed.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With respect to the description of the drawings, the same or similar reference numeral may be used for the same or similar component.

DETAILED DESCRIPTION

Figure 1:
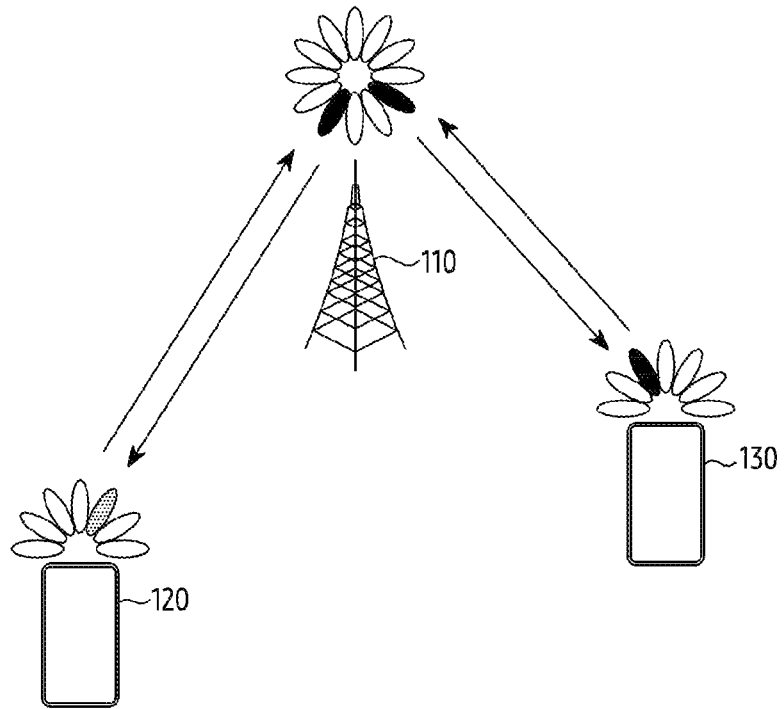
FIG. 1 is a diagram illustrating an example wireless communication system according to embodiments.

Terms used in the present disclosure are used to describe a various example embodiments, and are not intended to limit the scope of the disclosure. A singular expression may include a plural expression unless it is clearly meant differently in the context. The terms used herein, including a technical or scientific term, may have the same meaning as generally understood by one having ordinary knowledge in the technical field described in the present disclosure. Terms defined in a general dictionary among the terms used in the present disclosure may be interpreted with the same or similar meaning as a contextual meaning of related technology, and unless clearly defined in the present disclosure, it should not be interpreted in an ideal or excessively formal meaning. In some cases, even terms defined in the present disclosure may not be interpreted to exclude embodiments of the present disclosure.

In various embodiments of the present disclosure described below, a hardware approach is described as an example. However, since the various embodiments of the present disclosure include technology that use both hardware and software, the various embodiments of the present disclosure do not exclude a software-based approach.

A term referring to a part of electronic device (e.g., substrate, print circuit board (PCB), flexible PCB (FPCB), module, antenna, antenna element, circuit, processor, chip, component, device), a term referring to a certain part (e.g., area, region, portion), a term referring to a shape of a part (e.g., structure, construction, supporting part, contacting part, protruding part), a term referring to a connecting part between structures (e.g., connecting part, contacting part, supporting part, contact structure, conductive member, assembly), a term referring to a circuit (e.g., PCB, FPCB, signal line, feeding line, data line, RF signal line, antenna line, RF path, RF module, RF circuit, splitter, divider, coupler, combiner), and the like used in the following description are used and illustrated for convenience of description. Accordingly, the present disclosure is not limited to terms described below, and another term having an equivalent technical meaning may be used. A term such as ' . . . unit', ' . . . er', ' . . . material', ' . . . body', and the like used below may refer, for example, to at least one shape structure, or may refer, for example, to a unit that processes a function.

In the present disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with ' more than', a condition described as 'less than or equal to' may be replaced with 'less than', and a condition described as 'more than or equal to and less than' may be replaced with 'more than and less than or equal to'. Hereinafter, 'A' to 'B' may refer, for example, to at least one of elements from A (including A) and to B (including B).

The present disclosure describes various embodiments using terms used in some communication standards (e.g., 3rd Generation Partnership Project (3GPP), European Telecommunications Standards Institute (ETSI), extensible radio access network (xRAN), and open-radio access network (O-RAN), but this is simply an example for description. Various embodiments of the present disclosure may be easily modified and applied to other communication systems as well.

FIG. 1 is a diagram illustrating an example wireless communication system according to embodiments. A wireless communication environment 100 of FIG. 1 illustrates a base station 110 and terminals 120, 130 as a portion of nodes using a wireless channel.

The base station 110 is a network infrastructure that provides wireless access to the terminal 120. The base station 110 has coverage defined as a constant geographic area based on a distance capable of transmitting a signal. The base station 110 may be referred to as a massive multiple input multiple output (MIMO) unit (MMU), an 'access point (AP)', 'eNodeB (eNB)', '5th generation node (5G node)', '5G NodeB (NB)', 'wireless point', 'transmission/reception point (TRP)', 'access unit', 'distributed unit (DU)', 'transmission/reception point (TRP)', 'radio unit (RU)', 'remote radio head (RRH)', or another term having an equivalent technical meaning, in addition to a base station. The base station 110 may transmit a downlink signal or may receive an uplink signal.

The terminal 120 is a device used by a user and performs communication with the base station 110 through the wireless channel. In some cases, the terminal 120 may be operated without user involvement. In other words, the terminal 120 is a device that performs machine type communication (MTC) and may not be carried by a user. The terminal 120 may be referred to as a user equipment (UE), a mobile station, a subscriber station, a customer premises equipment (CPE), a remote terminal, a wireless terminal, an electronic device, a terminal for vehicle, a user device, or another term having an equivalent technical meaning, in addition to the terminal.

The terminal 120 and a terminal 130 illustrated in FIG. 1 may support vehicle communication. In case of the vehicle communication, in LTE system, standardization work for V2X technology based on a device-to-device (D2D) communication structure was completed in 3GPP Release 14 and Release 15, and an effort is currently underway to develop V2X technology based on 5G NR. In NR V2X, unicast communication between the terminal and the terminal, groupcast (or multicast) communication, and broadcast communication are supported.

As one of the technology for mitigating radio wave path loss and increasing a transmission distance of radio wave, beamforming technology is being used. In order to form beamforming coverage instead of forming a signal in an isotropic pattern using a single antenna, communication equipment may be equipped with multiple antennas. Hereinafter, an antenna array including the multiple antennas will be described. The base station 110 or the terminal 120 may include the antenna array. Each antenna included in the antenna array may be referred to as an array element or an antenna element. Hereinafter, in the present disclosure, the antenna array is illustrated as a two-dimensional planar array, but this is simply an example and does not limit embodiments of the present disclosure. The antenna array may be configured in various forms such as a linear array or a multilayer array. The antenna array may be referred to as a massive antenna array.

A technology that improves the data capacity of 5G communication is beamforming technology using the antenna array connected to multiple RF paths. The number of parts that perform wireless communication to increase communication performance is increasing. For example, since the number of the antenna, an RF part (e.g., amplifier, filter) and components for processing RF signals received or transmitted through the antenna are increased, spatial gain and cost efficiency are essentially required while satisfying communication performance in configuring communication equipment.

Figure 2A:
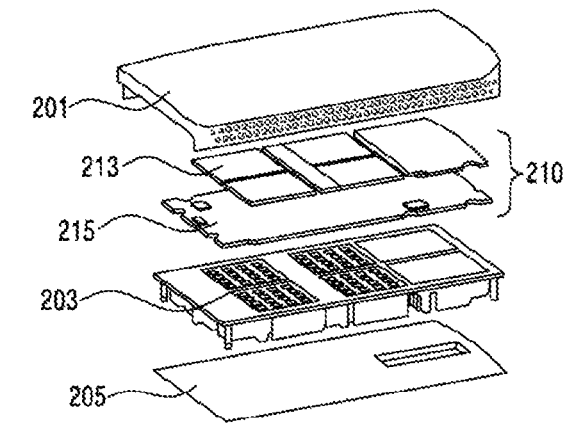
FIGS. 2A and 2B include an exploded perspective view and a diagram illustrating examples of components of an electronic device according to embodiments.
Figure 2A:
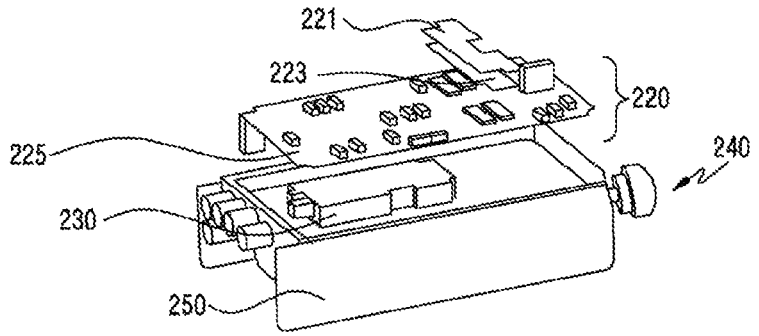
Figure 2B:
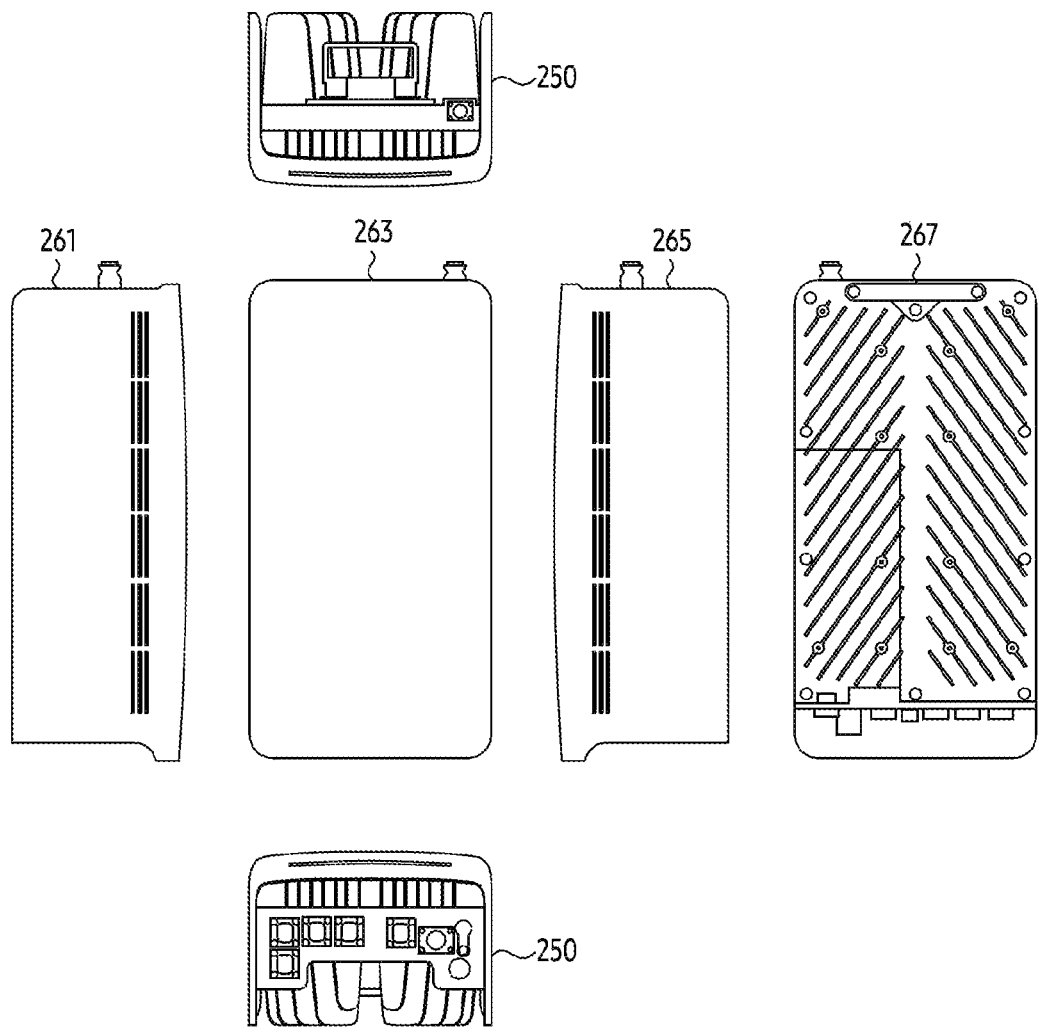

FIGS. 2A and 2B include an exploded perspective view and a diagram illustrating examples of components of an electronic device according to embodiments. FIG. 2A is an exploded perspective view illustrating internal components of an electronic device 200 according to embodiments, and FIG. 2B is a diagram illustrating an upper surface, a lower surface, and a side surface of the electronic device 200 according to embodiments. The electronic device 200 illustrates a base station 110 of FIG. 1, but descriptions of the electronic device 200 to be described later may be applied to a terminal 120 or a terminal 130.

Referring to FIG. 2A, the electronic device 200 may include a radome cover 201, a RU housing 203, a digital unit (or distributed unit) (DU) cover 205, and a RU module 210. The RU module 210 may include an antenna module 213 and an RU board 215. RF components for the antenna module 213 may be disposed on the RU board 215. The RF components may include at least one of a connector, a DC/DC converter, field programmable gate array (FPGA), LDO regulator, or local oscillator (LO) for providing power. The RU module 210 may include the antenna module including an additional resonator disposed together with a radiator according to various embodiments of the present disclosure to be described later.

A substrate on which the antenna module 213 is disposed may be referred to as an antenna board, an antenna substrate, a radiation substrate, a radiation board, or an RF board. According to an embodiment, the substrate on which the antenna module 213 is disposed may be a printed circuit board (PCB). According to an embodiment, the substrate on which the antenna module 213 is disposed may be a flexible PCB (FPCB). The RU board 215 may be referred to as a main board, a main substrate, a power board, a mother board, a package board, or a filter board. The RU module 210 may be referred to as a baseband unit (BBU) or a baseband equipment. Furthermore, in order to refer to an integrated base station mounted with the RU module 210, terms such as an access unit (AU), a compact macro, or a link cell may be used instead for the operation and function of the RU module 210.

The electronic device 200 may include a DU module 220. The DU module 220 may include an interface board 221, a modem board 223, and a CPU board 225. The electronic device 200 may include a power module 230, a GPS 240, and a DU housing 250. The DU module 220 may be referred to as a radio unit (RU) or a remote radio head (RRH).

Referring to FIG. 2B, a housing 250 is an illustration of the electronic device 200 viewed from above. Reference numbers 261, 263, 265 and 267 illustrate the electronic device 200 viewed from the left, front, right, and rear, respectively. Reference number 270 illustrates the electronic device 200 viewed from the bottom.

Figure 3A:
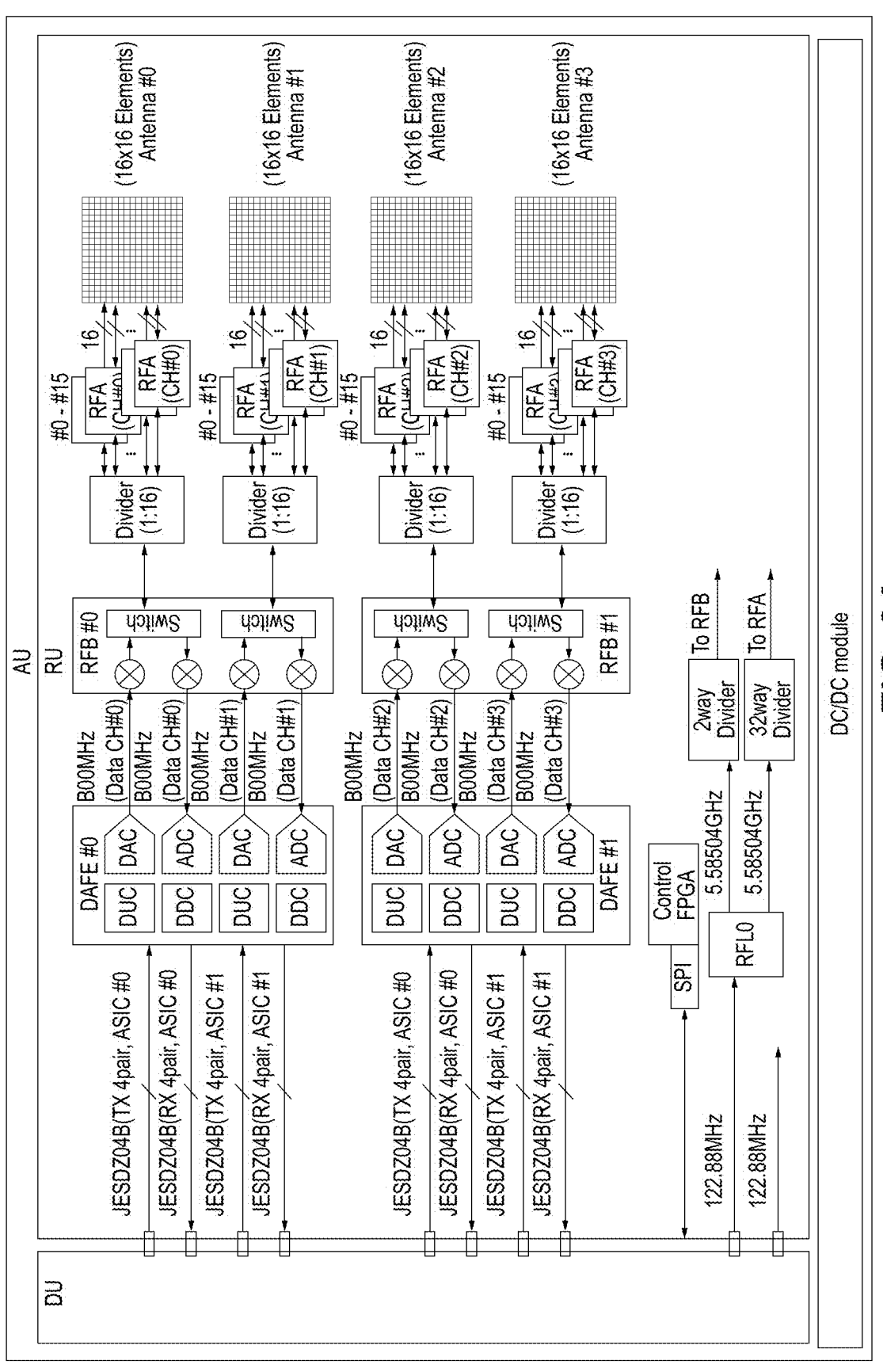
FIGS. 3A and 3B are diagrams illustrating example configurations of an electronic device according to embodiments.
Figure 3B:
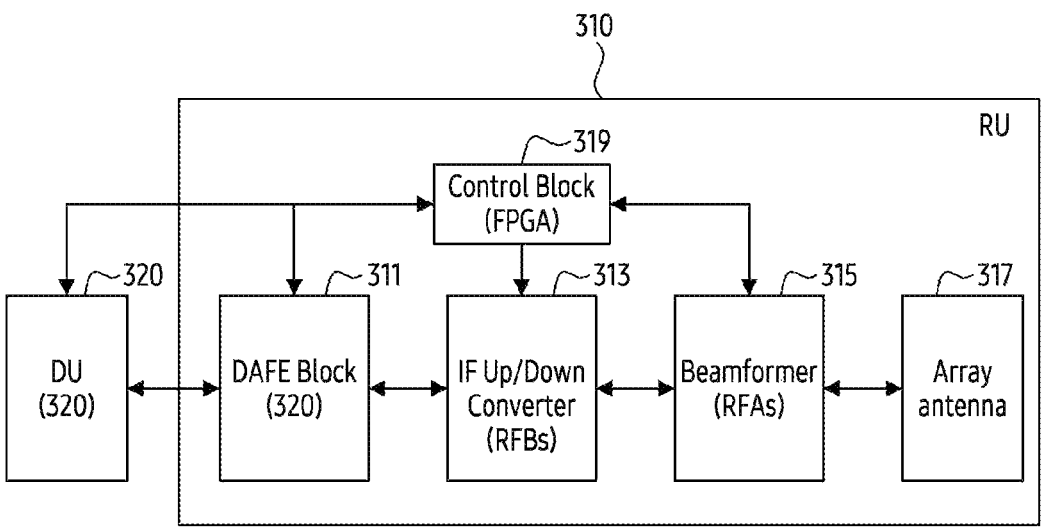

FIGS. 3A and 3B are diagrams illustrating example configurations of an electronic device according to embodiments. The electronic device (e.g., an electronic device 200) may include an access unit. The access unit may include a RU 310, a DU 320, and a DC/DC module. The RU 310 according to embodiments of the present disclosure may refer, for example, to an assembly in which antennas and RF components are mounted. The DU 320 according to embodiments of the present disclosure may be configured to process a digital wireless signal, and may be configured to encrypt the digital wireless signal to be transmitted to the RU 310, or decrypt the digital wireless signal transmitted from the RU 310. The DU 320 may be configured to perform communication with an upper node (e.g., a centralized unit (CU) or a core network (e.g., 5GC, EPC) by processing packet data.

Referring to FIG. 3A, the RU 310 may include a plurality of antenna elements. The RU 310 may include one or more array antennas. According to an embodiment, the array antenna may be configured with a planar antenna array. The array antenna may correspond to one stream. The array antenna may include the plurality of antenna elements corresponding to one transmission path (or reception path). For example, the array antenna may include 256 antenna elements configured with 16×16.

The RU 310 may include RF chains for processing a signal of each array antenna. The RF chains may be referred to as 'RFA'. The RFA may include the RF components (e.g., phase converter, power amplifier) for beamforming, and a mixer. The mixer of the RFA may be configured to down-convert an RF signal of an RF frequency to an intermediate frequency or up-convert a signal of the intermediate frequency to a signal of the RF frequency. According to an embodiment, one set of the RF chains may correspond to one array antenna. For example, the RU 310 may include four RF chain sets for four array antennas. A plurality of RF chains may be connected to the transmission path or the reception path through a divider (e.g., 1:16). Although not illustrated in FIG. 3A, according to an embodiment, the RF chains may be implemented as a radio frequency integrated circuit (RFIC). The RFIC may process and generate the RF signals supplied to the plurality of antenna elements.

The RU 310 may include a digital analog front end (DAFE), and 'RFB'. The DAFE may be configured to interconvert a digital signal and an analog signal. For example, the RU 310 may include two DAFEs (DAFE #0, DAFE #1). The DAFE may be configured to up-convert the digital signal (e.g., DUC), and convert the up-converted signal into the analog signal (e.g., DAC), in the transmission path. The DAFE may be configured to convert the analog signal into the digital signal (e.g., ADC), and down-convert the digital signal (e.g., DDC), in the reception path. The RFB may include the mixer and a switch, corresponding to the transmission path and the reception path. The mixer of the RFB may be configured to up-convert the baseband frequency to the intermediate frequency or down-convert the signal of the intermediate frequency to a signal of the baseband frequency. The switch may be configured to select one of the transmission path and the reception path. For example, the RU 310 may include two RFBs (RFB #0, RFB #1).

The RU 310 may include a controller (e.g., including control and/or processing circuitry) and/or may include a field programmable gate array (FPGA). FPGA may refer, for example, to a semiconductor device including a designable logic device and a programmable internal circuit. Communication with the DU 320 may be performed through Serial Peripheral Interface (SPI) communication.

The RU 310 may include a RF local oscillator (LO). The RF LO may be configured to supply a reference frequency for up-conversion or down-conversion. According to an embodiment, the RF LO may be configured to provide a frequency for up-conversion or down-conversion of the RFB described above. For example, the RF LO may supply the reference frequency to RFB #0 and RFB #1 through a 2-way divider.

According to an embodiment, the RF LO may be configured to provide the frequency for up-conversion or down-conversion of the RFA described above. For example, the RF LO may supply the reference frequency to each RFA (8 for each RF chain, by polarization group) through a 32-way divider.

Referring to FIG. 3B, the RU 310 may include a DAFE block 311, an IF upward/downward conversion unit 313, a beamformer 315, an array antenna 317, and a control block 319. The DAFE block 311 may convert the digital signal into the analog signal or may convert the analog signal into the digital signal. The IF upward/downward conversion unit 313 may correspond to the RFB. The IF upward/downward conversion unit 313 may convert the signal of the baseband frequency into a signal of an IF frequency, or may convert the signal of the IF frequency into the signal of the baseband frequency, based on the reference frequency supplied from the RF LO. The beamformer 315 may correspond to the RFA. The beamformer 315 may convert the signal of the RF frequency into the signal of the IF frequency, or may convert the signal of the IF frequency into the signal of the RF frequency, based on the reference frequency supplied from the RF LO. The array antenna 317 may include the plurality of antenna elements. Each antenna element of the array antenna 317 may be configured to radiate a signal processed through the RFA. The array antenna 317 may be configured to perform the beamforming according to a phase applied by the RFA. The control block 319 may control each block of the RU 310 to perform the command from the DU 320 and the signal processing described above.

The base station 110 is illustrated as an example of the electronic device 200 in FIGS. 2A, 2B, 3A and 3B, but embodiments of the present disclosure are not limited to a base station 110. Embodiments of the present disclosure may be applied to the electronic device for radiating of a wireless signal as well as the base station configured with the DU and the RU.

As technology develops, equal reception performance is secured while improving transmission output, and support for a dual band (e.g., a 28 GHz band and a 39 GHz band) is required. The plurality of antenna elements may be used to support a mmWave band. Mass production reliability is inevitably required to mount the plurality of antenna elements in a RU module (e.g., a RU module 210). To address these requirements and reduce unit costs, embodiments of the present disclosure disclose a module (e.g., an antenna module or the RU module) in which additional resonators are disposed on a substrate (e.g., a PCB or FPCB) including a radiator (e.g., a patch antenna) and the electronic device including the same, instead of disposing additional FPCBs and pillars (e.g., stainless (SUS)) on the radiator.

Figure 4:
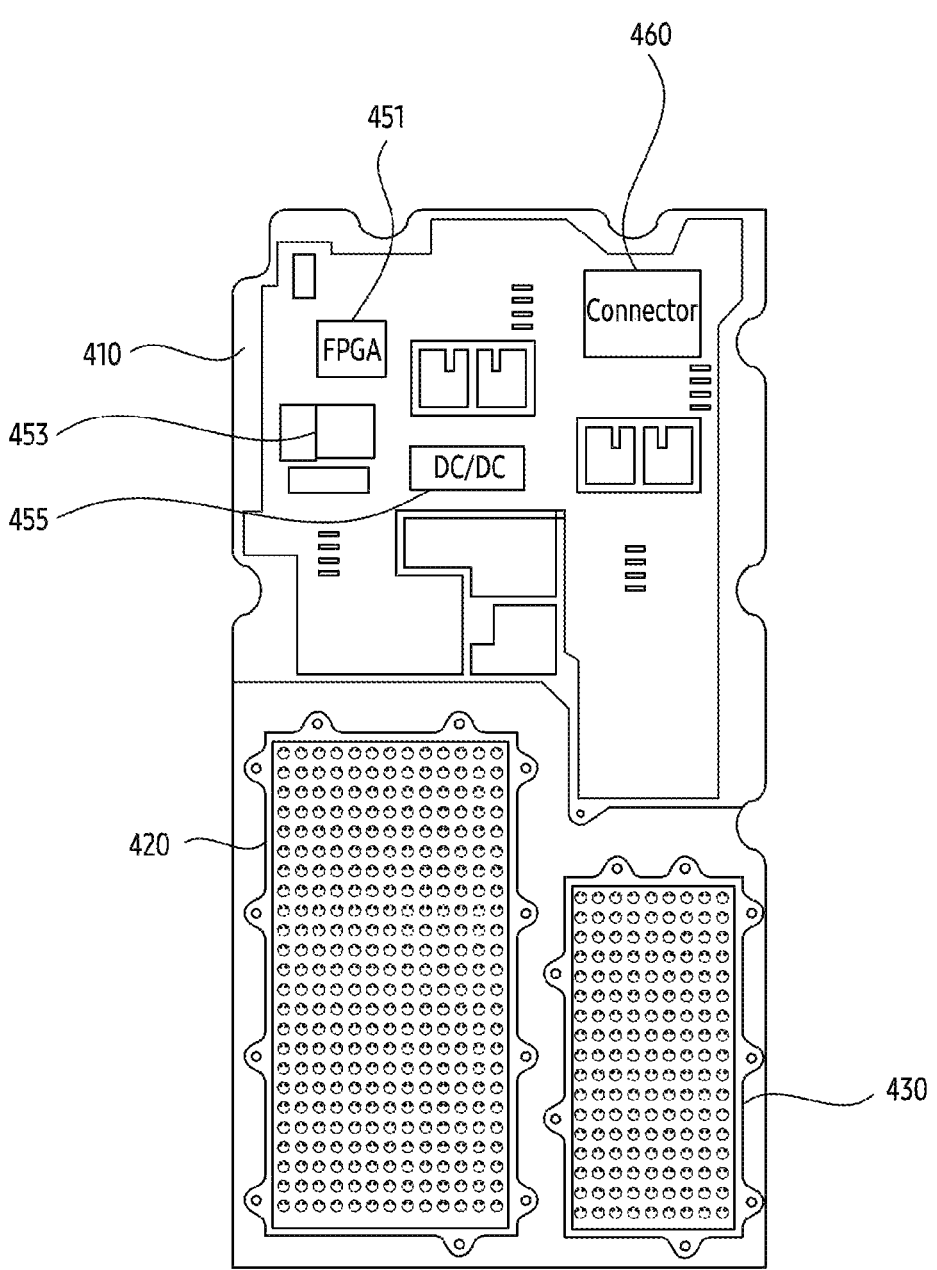
FIG. 4 is a diagram illustrating an example of a radio unit (RU) module of an electronic device according to embodiments.

FIG. 4 is a diagram illustrating an example of a radio unit (RU) module of an electronic device according to embodiments. The RU module (e.g., a RU module 220) of the electronic device (e.g., an electronic device 200) may refer, for example, to a structure in which a substrate (hereinafter, a first substrate) (e.g., PCB, FPCB) on which antennas of an antenna module are mounted and a substrate (hereinafter, a second substrate) (e.g., a PCB) on which antenna modules and signal processing components (e.g., a connector, a direct current (DC)/DC converter, DFE) are mounted are separated and disposed. The first substrate may be referred to as an antenna board, an antenna substrate, a radiation substrate, a radiation board, or an RF board. The second substrate may be referred to as a RU board, a main board, a power board, a mother board, a package board, or a filter board. Hereinafter, the second substrate is referred to as a RU board 410 and described.

Referring to FIG. 4, the RU board 410 may include components for signal transmission to a radiator (e.g., an antenna). According to an embodiment, one or more first substrates may be disposed on the RU board 410. The RU board 410 may include an antenna substrate 420 for a first frequency band (e.g., a 28 GHz band) and an antenna substrate 430 for a second frequency band (e.g., a 39 GHz band). In other words, one or more array antennas may be mounted on the RU board 410. For example, two array antennas may be mounted on the RU board 410. In FIG. 4, two antenna modules, in other words, the array antennas supporting two frequency bands, are illustrated, but embodiments of the present disclosure are not limited thereto. Two array antennas may be disposed for each band to support the dual band, and the array antennas mounted on the RU board 410 may be configured to support 2-transmit 2-receive (2T2R).

The RU board 410 may include parts for supplying an RF signal to the antenna. For example, the RU board 410 may include one or more radio frequency programmable gain amplifiers (FPGAs) 451. For example, the RU board 410 may include one or more local oscillators (Los) 453. The LO 453 may be used to supply a reference frequency for up-conversion or down-conversion in an RF system. For example, the RU board 410 may include one or more DC/DC converters 455. The DC/DC converter 455 may be used to convert direct current to direct current. For example, the RU board 410 may include one or more connectors 460. The connector 460 may be used to transmit an electrical signal. The RU board 410 may further include various parts for signal processing. For example, the RU board 410 may include one or more dividers. The divider may be used to distribute the input signal and transmit the input signal to multiple paths. For example, the RU board 410 may include one or more low-dropout regulators (LDOs). The LDO may be used to suppress external noise and supply power. For example, the RU board 410 may include one or more Voltage regulator modules (VRMs). The VRM may refer, for example, to a module for ensuring that an appropriate voltage is maintained. For example, the RU board 410 may include one or more digital front ends (DFEs). For example, the RU board 410 may include one or more intermediate frequency (IF) processing units. For example, the RU board 410 may include an RF filter for filtering the signal. Meanwhile, with the configuration illustrated in FIG. 4, some of the parts illustrated in FIG. 4 may be omitted or a greater number of parts may be mounted.

Figure 5A:
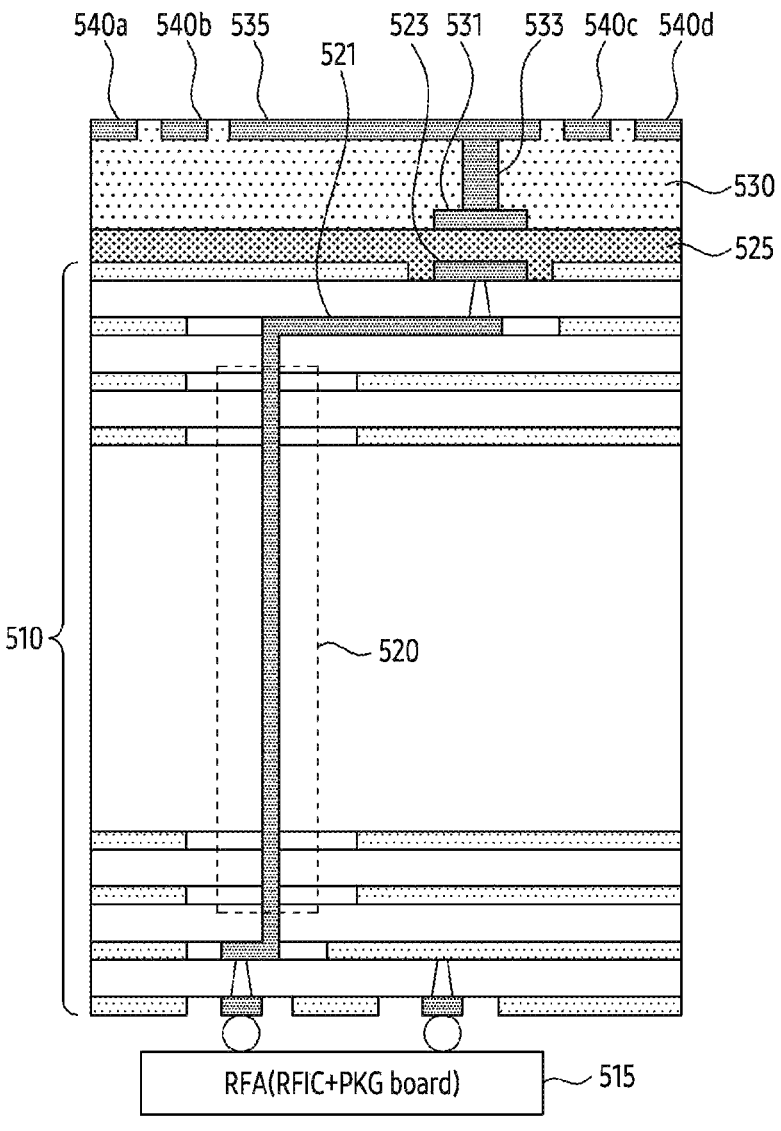
FIG. 5A is a cross-sectional view illustrating an example of a stacked structure of a RU module according to embodiments.

FIG. 5A is a cross-sectional view illustrating an example of a stacked structure of a RU module according to embodiments. The RU module (e.g., a RU module 220) may include an antenna module (e.g., an antenna module 213) and a RU board (e.g., a RU board 215).

Referring to FIG. 5A, the RU module 220 may include a second substrate 510 corresponding to the RU board 215. The RU module 220 may include a first substrate 530 corresponding to an antenna board of the antenna module 213. The first substrate 530 may include a radiator 535. Alternatively, the radiator 535 may be disposed on one surface of the first substrate 530. The first substrate 530 may be electrically connected to the second substrate 510. For example, the first substrate 530 may be electrically connected to the second substrate 510 through an adhesive member 525. The first substrate 530 may be disposed on an adhesive layer (e.g., the adhesive member 525) stacked on one surface of the second substrate 510. For example, the first substrate 530 may be electrically connected to the second substrate 510 through a grid array (e.g., a ball grid array (BGA), a land grid array (LGA). The first substrate 530 may be referred to as an antenna board, an antenna substrate, a radiation substrate, a radiation board, or an RF board. The second substrate 510 may be referred to as a main board, a main substrate, a power board, a mother board, a package board, or a filter board.

The second substrate 510 may be electrically connected to an RF processing unit (e.g., a RFA 515). Although illustrated as the RFA 515 in FIG. 5A, the implementation may be modified in a form (e.g., BGA) to be electrically connected to a separate board (e.g., a PCB) on which the RFIC is mounted. The second substrate 510 may include a feeding unit to transmit signals received from the RF processing unit to a radiator. The second substrate 510 may include a via hole 520 (e.g., a low-cost frame retardant (FR)-4) and a feedline 521. The signals received through the via hole 520 and the feedline 521 may be transmitted to the first substrate 530 of the antenna module, through a coupling pad 523. The coupling pad 523 of the second substrate 510 may be coupled to a coupling pad 531 of the first substrate 530. Through the coupling pad 523 of the second substrate 510, an RF-processed signal (hereinafter, an RF signal) may be transmitted to the coupling pad 531 of the first substrate 530. In FIG. 5A, it is described that the feedline 521 is disposed on a layer (e.g., a top layer) of the second substrate 510, but embodiments of the present disclosure are not limited thereto. The feedline 521 may also be disposed on a layer (e.g., a bottom layer) of the first substrate 530.

Components for the antenna module 213 may be disposed in the first substrate 530. According to an embodiment, the first substrate 530 may be a flexible PCB (FPCB). According to an embodiment, the first substrate 530 may be the PCB. The first substrate 530 may include the coupling pad 531, a feeding hole 533, and the radiator 535, in order to receive a signal transmitted from the second substrate 510 or transmit the signal received through a wireless channel to the second substrate 510. For example, an electronic device (e.g., an electronic device 200) including the RU module 220 may transmit the signal. The coupling pad 531 may obtain the RF signal through coupling feeding of the coupling pad 523 of the second substrate 510. The coupling pad 531 may transmit the RF signal to the radiator 535 through the feeding hole 533. The radiator 535 may radiate the RF signal into the air.

The first substrate 530 according to embodiments may include one or more resonators in addition to the radiator 535. That the first substrate 530 includes the resonator may refer, for example, to the resonator being mounted on an inner layer of the first substrate 530 or the resonator being disposed on one surface of the first substrate 530. For example, the one or more resonators may include a resonator 540a, a resonator 540b, a resonator 540c, and a resonator 540d. According to an embodiment, the one or more resonators may not be located on a separate substrate (e.g., the FPCB using SUS), but may be disposed on the first substrate 530 on which the radiator 535 is mounted. The one or more resonators may function as an array together with the radiator 535.

According to an embodiment, the one or more resonators may be disposed on the same layer as the layer on which the radiator 535 is disposed. In other words, the radiator 535 and the one or more resonators may be located on the same single layer of the first substrate 530. According to an embodiment, the one or more resonators may be disposed on the layer adjacent to the layer on which the radiator 535 is disposed. For example, in case that the radiator 535 is disposed on the highest layer of the first substrate 530 (hereinafter, layer 1 (L1)), the one or more resonators may be disposed on the layer (e.g., L2 and L3) that is one or two steps lower than the layer on which the first substrate 530 is disposed. For another example, in case that the radiator 535 is disposed on the layer (e.g., L2 and L3) that is one or two steps lower than the highest layer of the first substrate 530, the one or more resonators may be disposed on the highest layer (e.g., L1) of the first substrate 530. An example in which the one or more resonators are disposed on the layer adjacent to the layer on which the radiator 535 is disposed will be described in detail with reference to FIGS. 6, 7A, 7B and 7C.

Figure 5B:
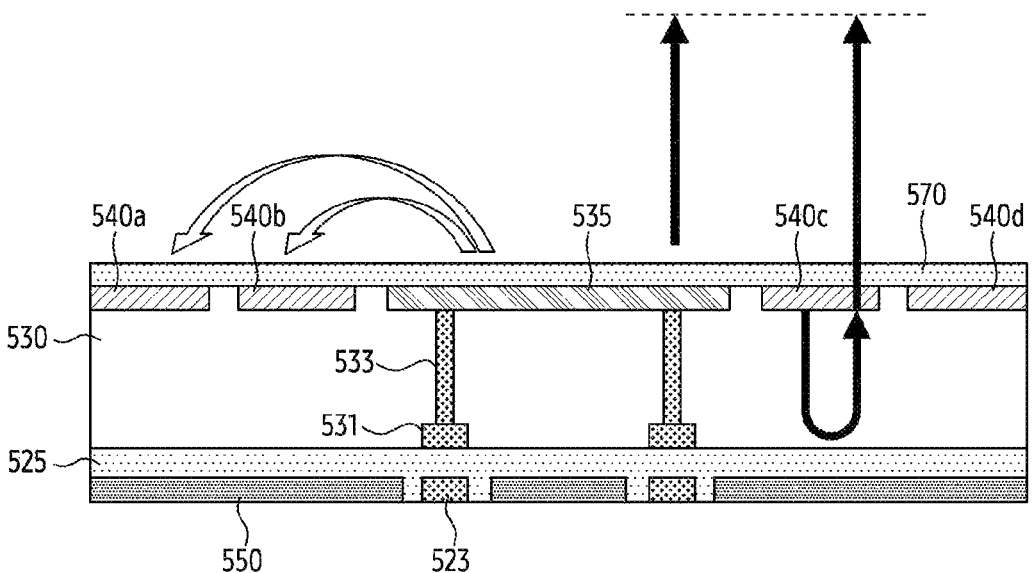
FIG. 5B is a cross-sectional view illustrating an example of a radiator and a resonator of a RU module according to embodiments.

FIG. 5B is a diagram illustrating an example of a radiator and a resonator of a RU module according to embodiments. The RU module (e.g., a RU module 220) may include an antenna module (e.g., an antenna module 213) and a RU board (e.g., a RU board 215). FIG. 5A may be referred to explain performance improvement according to the radiator (e.g., a radiator 535) and the resonator (e.g., a resonator 540a, a resonator 540b, a resonator 540c, and a resonator 540d) of the RU module 220.

Referring to FIG. 5B, a first substrate 530 may include a coupling pad 531, a feeding hole 533, and the radiator 535, in order to receive a signal transmitted from a second substrate 510 or transmit the signal received through a wireless channel to the second substrate 510. For example, the first substrate 530 may be electrically connected to a second substrate (e.g., the second substrate 510) through an adhesive member 525. For example, the coupling pad 531 of the first substrate 530 may receive a coupling and fed RF signal, through a coupling pad 523 of a ground layer 550 of the second substrate 510. For example, the first substrate 530 may include a coating layer 570.

Since the radiator 535 is disposed on the first substrate 530 together with the resonator (e.g., the resonator 540a, the resonator 540b, the resonator 540c, and the resonator 540d), bandwidth may be expanded and gain may be improved. Hereinafter, for convenience of description, the resonator 540b is described as an example.

Aspects of the performance improvement may include aspects of the bandwidth expansion and aspects of the gain improvement. The bandwidth expansion may refer, for example, to a frequency range of a communicable signal increasing. As the thickness of the substrate (e.g., the first substrate 530) increases, the bandwidth may be expanded. The expansion of the bandwidth may refer, for example, to the range of frequency that provide the gain of a certain value or more being widened. For example, the bandwidth and the thickness of the substrate may be expressed by the following equation.

$$BW = \frac{16}{3\sqrt{2}} \cdot \frac{p}{e_r} \cdot \frac{1}{\epsilon_r} \cdot \frac{h}{\lambda_0} \cdot \frac{W}{L} \cdot q \qquad \text{[Equation 1]}$$

BW may refer, for example, to the bandwidth, and h may refer, for example, to the thickness of the substrate. L represents the length of the antenna (e.g., a patch antenna), and W represents the width of the antenna.

As the size of the resonator 540b increases, the bandwidth may be expanded. Here, the size of the resonator 540b may refer, for example, to a planar width of the resonator 540b. For example, in case that the resonator 540b includes a surface of a quadrangle, the area of the quadrangle may correspond to the size of the resonator 540b. The size of the resonator 540b may be related to the resonance frequency of the resonator 540b. As the resonance frequency of the resonator 540b is formed adjacent to the resonance frequency of the radiator 535, the bandwidth may be formed to be wider. According to an embodiment, the difference between the size of the resonator 540b and the size of the radiator 535 may be within a critical range so that the resonance frequencies are formed adjacent to each other.

The gain improvement may refer, for example, to the intensity of the signal increasing and the reach distance increasing. The gain improvement due to the resonator 540*b* may be achieved by causing reinforcing interference between the signal of the radiator 535 and the signal due to the resonator 540*b*. When considering a frequency band (e.g., 28 GHz, 39 GHz), in order to achieve the reinforcing interference, it may be required that the thickness of the substrate (e.g., the first substrate 530) is thin. As the thickness of the first substrate 530 decreases, the gain may increase. In other words, the smaller the thickness of the first substrate 530, the smaller the change of the reflection phase of the signal. In the same principle, as the size of the resonator 540*b* is smaller, the gain improvement effect may be improved. For example, when the reflection phase of the resonator 540*b* is 0 degree, the maximum gain may be achieved. The thinner the thickness and the smaller the size, the closer the reflection phase may be to 0 degree.

As described above, the bandwidth expansion and the gain improvement may have a trade-off relationship. According to embodiments, the size of the resonator 540*b* may depend on the height of the first substrate 530.

In FIGS. 5A and 5B, it is described that all resonators are disposed at the same size and the same interval, but embodiments of the present disclosure are not limited thereto. For example, the size of the resonator relatively adjacent to the radiator may be larger than the size of the resonator relatively far from the radiator. For another example, the interval between the radiator and the resonator adjacent to the radiator or the interval between the radiators adjacent to the radiator may be wider than the interval between the resonators relatively far from the radiator.

Figure 6:
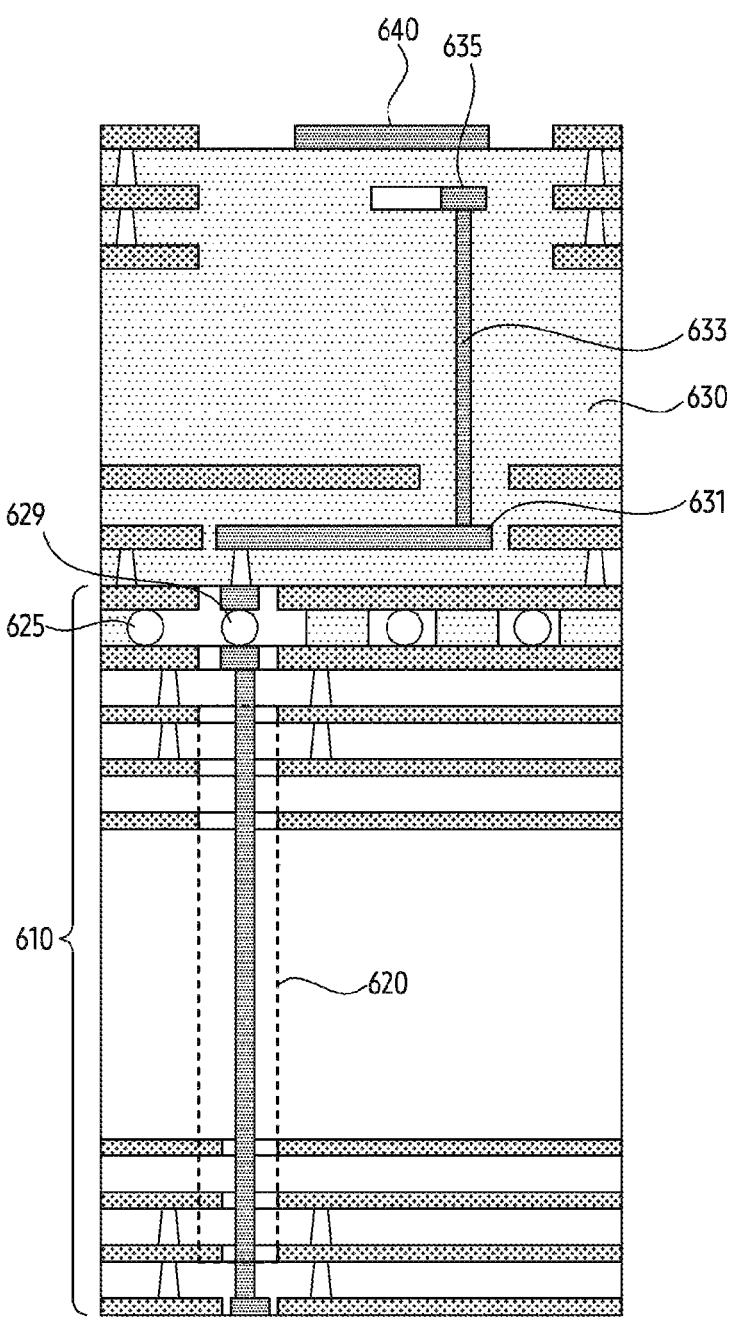
FIG. 6 is a cross-sectional view illustrating an example of a stacked structure of a RU board and an antenna board according to embodiments.

FIG. 6 is a cross-sectional view illustrating an example of a stacked structure of a RU board and an antenna board according to embodiments. A RU module (e.g., a RU module 220) may include an antenna module (e.g., an antenna module 213) and a RU board (e.g., a RU board 215) for disposing the antenna module 213. The antenna board may refer, for example, to a substrate (e.g., a PCB) on which an antenna module is disposed.

Referring to FIG. 6, the RU module 220 may include a second substrate 610 corresponding to the RU board 215. The RU module 220 may include a first substrate 630 corresponding to the antenna board. The first substrate 630 may include a radiator. The first substrate 630 may be electrically connected to the second substrate 610. For example, the first substrate 630 may be electrically connected to the second substrate 610 through a grid array (e.g., ball grid array (BGA) 625 and land grid array (LGA)). The first substrate 630 may be referred to as the antenna board, an antenna substrate, a radiation substrate, a radiation board, or an RF board. The second substrate 610 may be referred to as a main board, a main substrate, a power board, a mother board, a package board, or a filter board.

The second substrate 610 may be connected to an RF processing unit (e.g., RFA and RFIC) (not illustrated). The second substrate 610 may include a via hole 620 (e.g., a low-cost frame retardant (FR)-4) and a coupling pad 623. Signals received through the via hole 620 may be transmitted to the first substrate 630 of the antenna module through the coupling pad 623. A coupling pad 629 may obtain an RF signal through coupling feeding of the coupling pad 623 of the second substrate 610.

Components for the antenna module 213 may be disposed in the first substrate 630. According to an embodiment, the first substrate 630 may be the PCB. One or more first substrates 630 may be disposed on the second substrate 610.

Antenna elements of an array antenna may be disposed on each of the first substrates 630. The antenna element corresponds to a radiator 640. The first substrate 630 may include the coupling pad 629, a feedline 631, a feeding hole 633, a feeding pad 635, and the radiator 640, in order to receive a signal transmitted from the second substrate 610 or transmit the signal received through a wireless channel to the second substrate 610. For example, an electronic device (e.g., an electronic device 200) including the RU module 220 may transmit the signal. The coupling pad 629 may obtain the RF signal through coupling feeding of the coupling pad 623 of the second substrate 610. The coupling pad 629 may transmit the RF signal to the radiator 640 through the feedline 631, the feeding hole 633, and the feeding pad 635. The radiator 640 may radiate the RF signal into the air.

The first substrate 630 according to embodiments may include one or more resonators in addition to the radiator 640. According to an embodiment, the one or more resonators may not be disposed on a separate substrate (e.g., an FPCB using SUS), but may be disposed on the first substrate 610 that is the PCB on which the antenna module is disposed. The one or more resonators may function as an array together with the radiator 640. Hereinafter, examples of an arrangement between the resonators and the radiator 640 will be described with reference to FIGS. 7A, 7B and 7C.

In FIG. 6, the feedline 621 is illustrated as being disposed on a layer of the first substrate 630, but embodiments of the present disclosure are not limited thereto. The feedline 621 may be disposed on a layer (e.g., a top layer) of the second substrate 610.

In FIG. 6, it is described that all resonators are disposed at the same size and the same interval, but embodiments of the present disclosure are not limited thereto. For example, the size of the resonator relatively adjacent to the radiator may be larger than the size of the resonator relatively far from the radiator. For another example, the interval between the radiator and the resonator adjacent to the radiator or the interval between the radiators adjacent to the radiator may be wider than the interval between the resonators relatively far from the radiator.

Figure 7A:
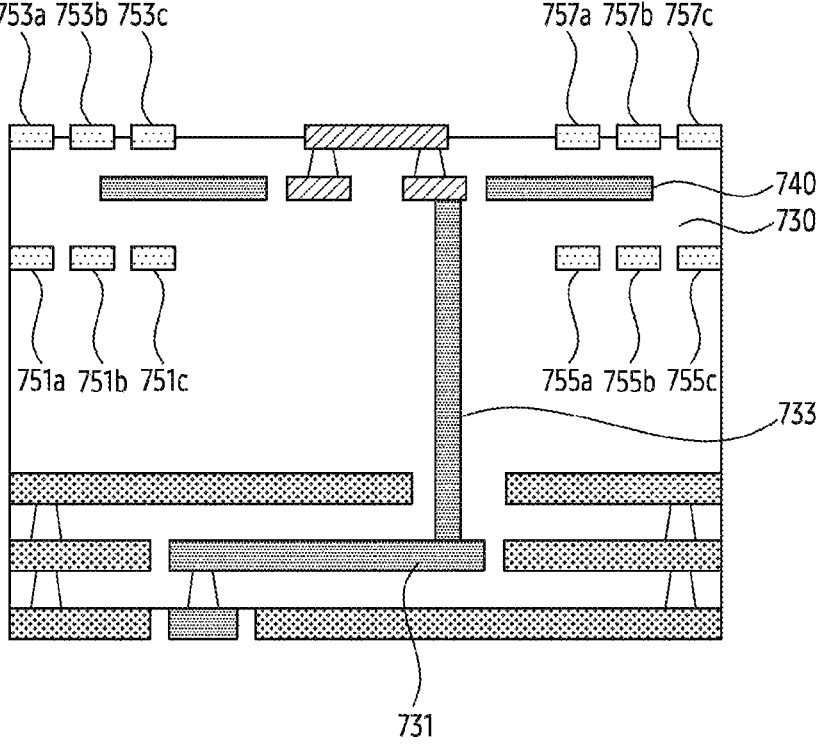
FIGS. 7A, 7B, and 7C are cross-sectional views illustrating examples of an antenna board including a resonator according to embodiments.
Figure 7B:
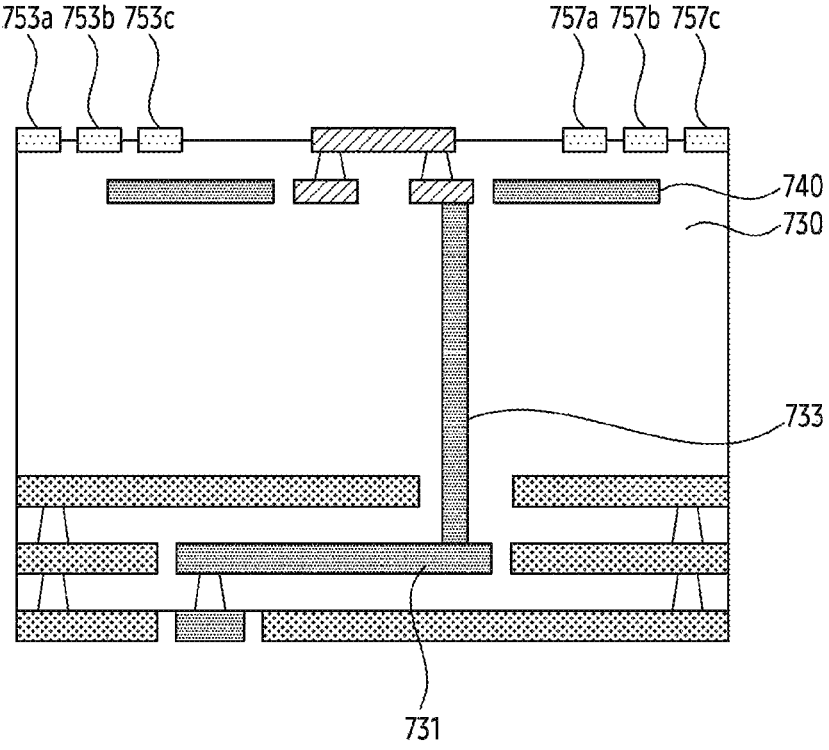
Figure 7C:
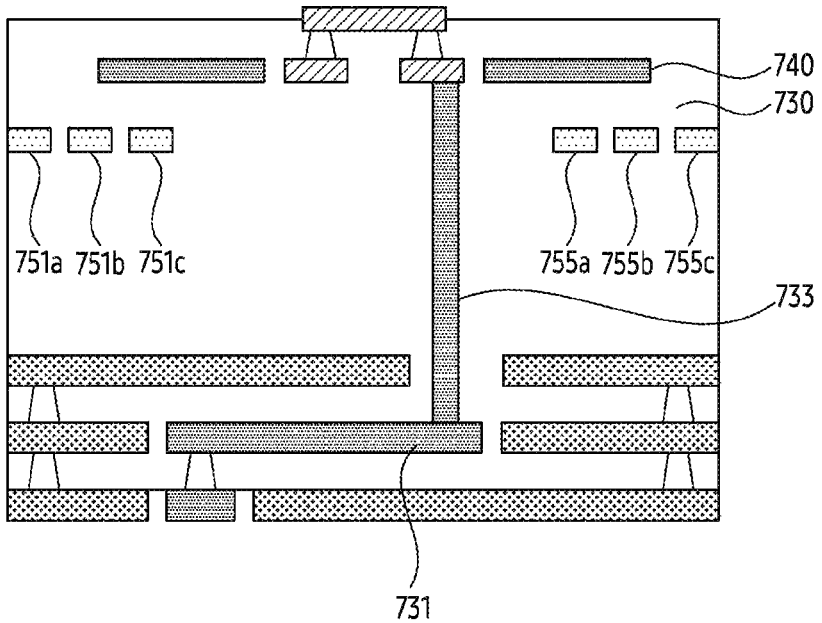

FIGS. 7A, 7B, and 7C are cross-sectional views illustrating examples of an antenna board including a resonator according to embodiments. An antenna module (e.g., an antenna module 213) may be mounted on the antenna board. FIG. 6 may be referred to describe various designs and deployments of the antenna board.

Referring to FIG. 7A, a RU module 220 may include a first substrate 730 corresponding to the antenna board. The first substrate 730 may include a feedline 731, a feeding hole 733, and a radiator 740, in order to transmit an RF signal through a wireless channel or process a signal received through the wireless channel.

In various embodiments, the first substrate 730 may include a plurality of resonators (e.g., a resonator 751*a*, a resonator 751*b*, a resonator 751*c*, a resonator 753*a*, a resonator 753*b*, a resonator 753*c*, a resonator 755*a*, a resonator 755*b*, a resonator 755*c*, a resonator 757*a*, a resonator 757*b*, and a resonator 757*c*). According to an embodiment, among the plurality of resonators, a group of resonators (e.g., the resonator 753*a*, the resonator 753*b*, the resonator 753*c*, the resonator 755*c*, the resonator 757*a*, the resonator 757*b*, and the resonator 757*c*) may be disposed on a layer (e.g., L1) higher than a layer (e.g., L2) on which the radiator 740 of the first substrate 730 is disposed. Among the plurality of resonators, another group of resonators (e.g., the resonator 751*a*, the resonator 751*b*, the resonator 751*c*, the resonator 755a, the resonator 755b, and the resonator 755c) may be disposed on a layer (e.g., L3) lower than the layer (e.g., L2) on which the radiator 740 of the first substrate 730 is disposed.

Through the plurality of resonators, the bandwidth may be expanded. As the resonance frequency in each resonator is disposed adjacent to the resonance frequency of the radiator 740, a frequency range having a low reflection coefficient may be widely formed. In addition, the signal of the radiator 740 is coupled through the plurality of resonators, so that a gain of a wireless signal may be improved. Meanwhile, as described above, the expansion of the bandwidth and the improvement of the gain are in a trade-off relationship. In order to support the required bandwidth and increase the required gain, the plurality of resonators may be disposed on a layer different from the layer on which the radiator 740 is located. In order to increase the signal gain, the resonators (e.g., the resonator 753a, the resonator 753b, the resonator 753c, the resonator 755c, the resonator 757a, the resonator 757b, and the resonator 757c) may be disposed on one surface of the first substrate 730 which is radiated. In order to increase the effect of resonance, additional resonators (e.g., the resonator 751a, the resonator 751b, the resonator 751c, the resonator 755a, the resonator 755b, and the resonator 755c) may be disposed on another layer (e.g., L3) of the first substrate 730. According to an embodiment, the resonator disposed on one surface and the resonator disposed on another layer may be disposed at a location facing each other. For example, the resonator 753b and the resonator 755b may be disposed at the same location in the layer.

Referring to FIG. 7B, the RU module 220 may include the first substrate 730 corresponding to the antenna board. The first substrate 730 may include the feedline 731, the feeding hole 733, and the radiator 740, in order to transmit the RF signal through the wireless channel or process the signal received through the wireless channel. For the first substrate 730 and related components of FIG. 7B, the description of FIG. 7A may be referred to.

In various embodiments, the first substrate 730 may include the plurality of resonators (e.g., the resonator 753a, the resonator 753b, the resonator 753c, the resonator 757a, the resonator 757b, and the resonator 757c) in addition to the radiator 740. According to an embodiment, the plurality of resonators may be disposed on the layer (e.g., L1) higher than the layer (e.g., L2) on which the radiator 740 of the first substrate 730 is disposed. Through the plurality of resonators, the bandwidth may be expanded. Through the plurality of resonators, the signal of the radiator 740 is coupled, so that the gain of the wireless signal may be improved. Meanwhile, unlike FIG. 7A, according to an embodiment, the resonators (e.g., the resonator 753a, the resonator 753b, the resonator 753c, the resonator 757a, the resonator 757b, and the resonator 757c) may be disposed only on a layer higher than the radiator 740. Due to the resonators disposed inside the first substrate 730, the manufacturing cost of the first substrate 730 may increase. Due to an alignment error for the resonators, performance may decrease. Accordingly, by disposing the resonators on one surface of the first substrate 730, the required gain and the required bandwidth of the radiator 740 of the first substrate may be satisfied.

Referring to FIG. 7C, the RU module 220 may include the first substrate 730 corresponding to the antenna board. The first substrate 730 may include the feedline 731, the feeding hole 733, and the radiator 740, in order to transmit the RF signal through the wireless channel or process the signal received through the wireless channel. For the first substrate 730 and related components of FIG. 7C, the description of FIG. 7A may be referred to.

In various embodiments, the first substrate 730 may include the plurality of resonators (e.g., the resonator 751a, the resonator 751b, the resonator 751c, the resonator 755a, the resonator 755b, and the resonator 755c) in addition to the radiator 740. According to an embodiment, the plurality of resonators may be disposed on the layer (e.g., L3) lower than the layer (e.g., L2) on which the radiator 740 of the first substrate 730 is disposed. The plurality of resonators may be disposed on an inner layer of the first substrate 730. Through the plurality of resonators, the bandwidth may be expanded. Through the plurality of resonators, the signal of the radiator 740 is coupled, so that the gain of the wireless signal may be improved. Meanwhile, unlike FIGS. 7B and 7C, according to an embodiment, the resonators (e.g., the resonator 751a, the resonator 751b, the resonator 751c, the resonator 755a, resonator 755b, and the resonator 755c) may be disposed only on a layer lower than the radiator 740. For example, the resonators may be located in advance inside the first substrate 730. The resonators are designed in advance when the first substrate 730 is manufactured, so that a process error may be reduced. The signal gain may be improved through the radiator 740 disposed on the first substrate 730, together with the resonators. High performance (e.g., bandwidth expansion, gain improvement) may be provided due to low process error. In other words, through the resonators disposed inside the first substrate 730, the required gain and the required bandwidth of the radiator 740 of the first substrate may be satisfied.

In FIGS. 7A, 7B and 7C, it is illustrated that the resonators and the radiator are formed on different layers, but embodiments of the present disclosure are not limited thereto. In other words, the embodiments illustrated in FIG. 5A and the embodiments illustrated in FIG. 6 may be combined. According to an embodiment, in an antenna substrate, at least one of the resonators may be disposed on the same layer as the radiator, and at least the other one of the resonators may be located on the layer adjacent to the layer of the radiator.

In FIGS. 7A, 7B and 7C, it is described that all resonators are disposed at the same size and the same interval, but embodiments of the present disclosure are not limited thereto. For example, the size of the resonator relatively adjacent to the radiator may be larger than the size of the resonator relatively far from the radiator. For another example, the interval between the radiator and the resonator adjacent to the radiator or the interval between the radiators adjacent to the radiator may be wider than the interval between the resonators relatively far from the radiator.

Figure 8:
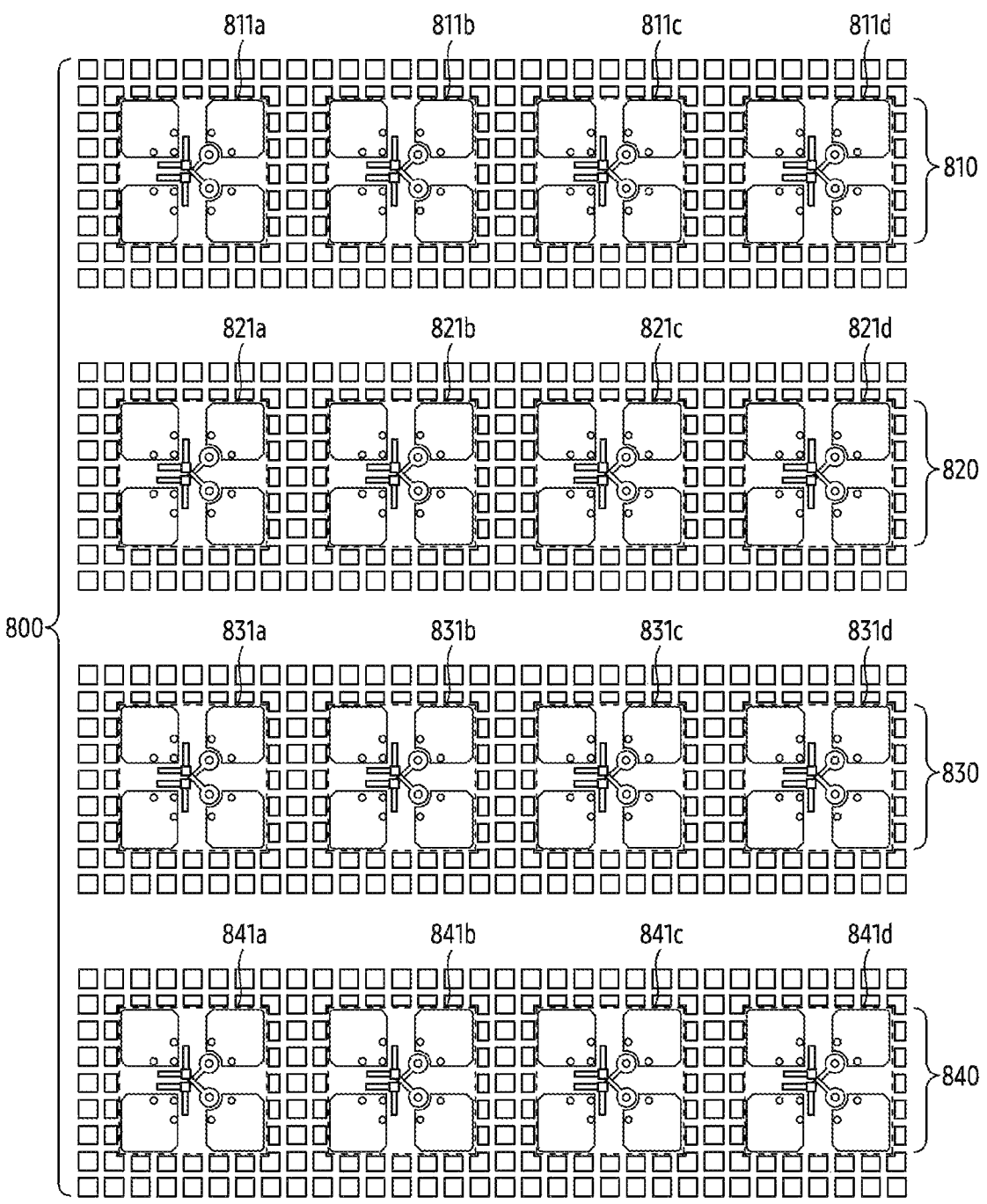
FIG. 8 is a diagram illustrating an example of an array antenna according to embodiments.

FIG. 8 is a diagram illustrating an example of an array antenna according to embodiments.

Referring to FIG. 8, an array antenna 800 may be disposed on an RU board (e.g., an RU board 215) of an RU module (e.g., an RU module 220). The RU board 215 may be referred to as a main board, a power board, a mother board, a package board, or a filter board. According to an embodiment, a plurality of PCBs (e.g., six PCBs) for the array antenna 800 may be disposed on the RU board 215. Each PCB of the plurality of PCBs may correspond to a first substrate (e.g., a first substrate 530, a first substrate 630, a first substrate 730, and hereinafter a first substrate 730). The first substrate illustrated in FIGS. 5A to 7C is for explaining a stacked structure. According to an embodiment, the first substrate 730 may include a plurality of radiators and a plurality of resonators. Hereinafter, sub-arrays included in the first substrate 730 will be described.

The array antenna 800 may include a first sub-array 810, a second sub-array 820, a third sub-array 830, and a fourth sub-array 840. The first sub-array 810, the second sub-array 820, the third sub-array 830, and the fourth sub-array 840 may be disposed on the first substrate 730. The first sub-array 810 may include four radiation areas (e.g., a radiation area 811a, a radiation area 811b, a radiation area 811c, and a radiation area 811d). Each radiation area in the first sub-array 810 may include one or more radiators (e.g., four radiators). The second sub-array 820 may include four radiation areas (e.g., a radiation area 821a, a radiation area 821b, a radiation area 821c, and a radiation area 821d). Each radiation area in the second sub-array 820 may include one or more radiators (e.g., four radiators). The third sub-array 830 may include four radiation areas (e.g., a radiation area 831a, a radiation area 831b, a radiation area 831c, and a radiation area 831d). Each radiation area in the third sub-array 830 may include one or more radiators (e.g., four radiators). The fourth sub-array 840 may include four radiation areas (e.g., a radiation area 841a, a radiation area 841b, a radiation area 841c, and a radiation area 841d). Each radiation area in the fourth sub-array 840 may include one or more radiators (e.g., four radiators).

According to embodiments, among the layers of the first substrate 730, a layer on which resonators are disposed and a layer on which a radiation area is disposed may be different from each other. For example, at least a portion of the resonators may be disposed on the layer (e.g., L1) higher than the layer (e.g., L2) of the radiator in an antenna substrate. For example, at least a portion of the resonators may be disposed on the layer (e.g., L2) lower than the layer (e.g., L1) of the radiator in the antenna substrate. However, embodiments of the present disclosure are not limited thereto. In an embodiment, at least a portion of the resonators may be disposed on the same layer as the radiator.

In FIG. 8, it is described that all resonators are disposed at the same size and the same interval, but embodiments of the present disclosure are not limited thereto. For example, the size of the resonator relatively adjacent to the radiator may be larger than the size of the resonator relatively far from the radiator. For another example, the interval between the radiator and the resonator adjacent to the radiator or the interval between the radiators adjacent to the radiator may be wider than the interval between the resonators relatively far from the radiator. For another example, the interval between the resonators between the sub-arrays, or the area of each resonator may be different. For still another example, based on a frequency band supported by an antenna module, the interval between the resonators, or the area of each resonator may vary.

Figure 9A:
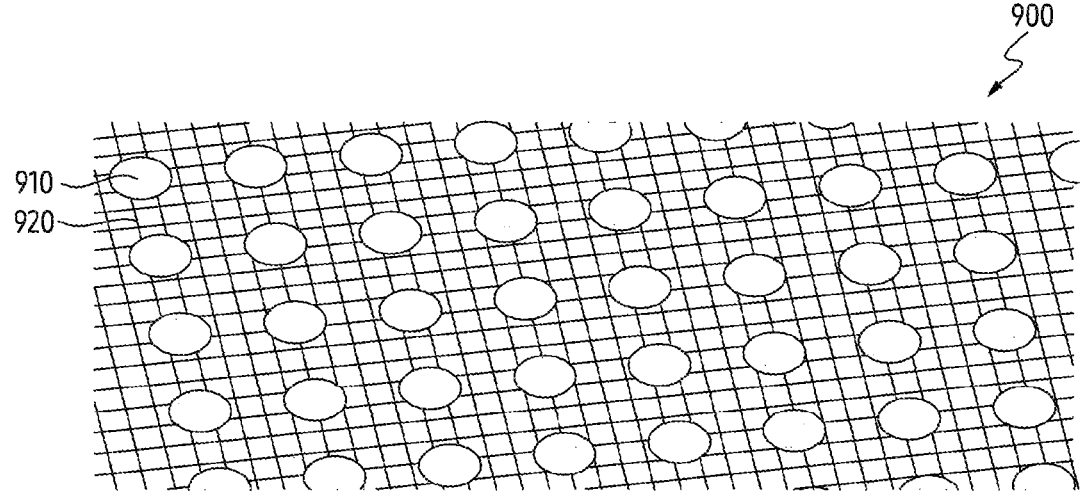
FIGS. 9A, 9B and 9C are diagrams illustrating an example of a radiation area including a radiator and a resonator according to embodiments.
Figure 9B:
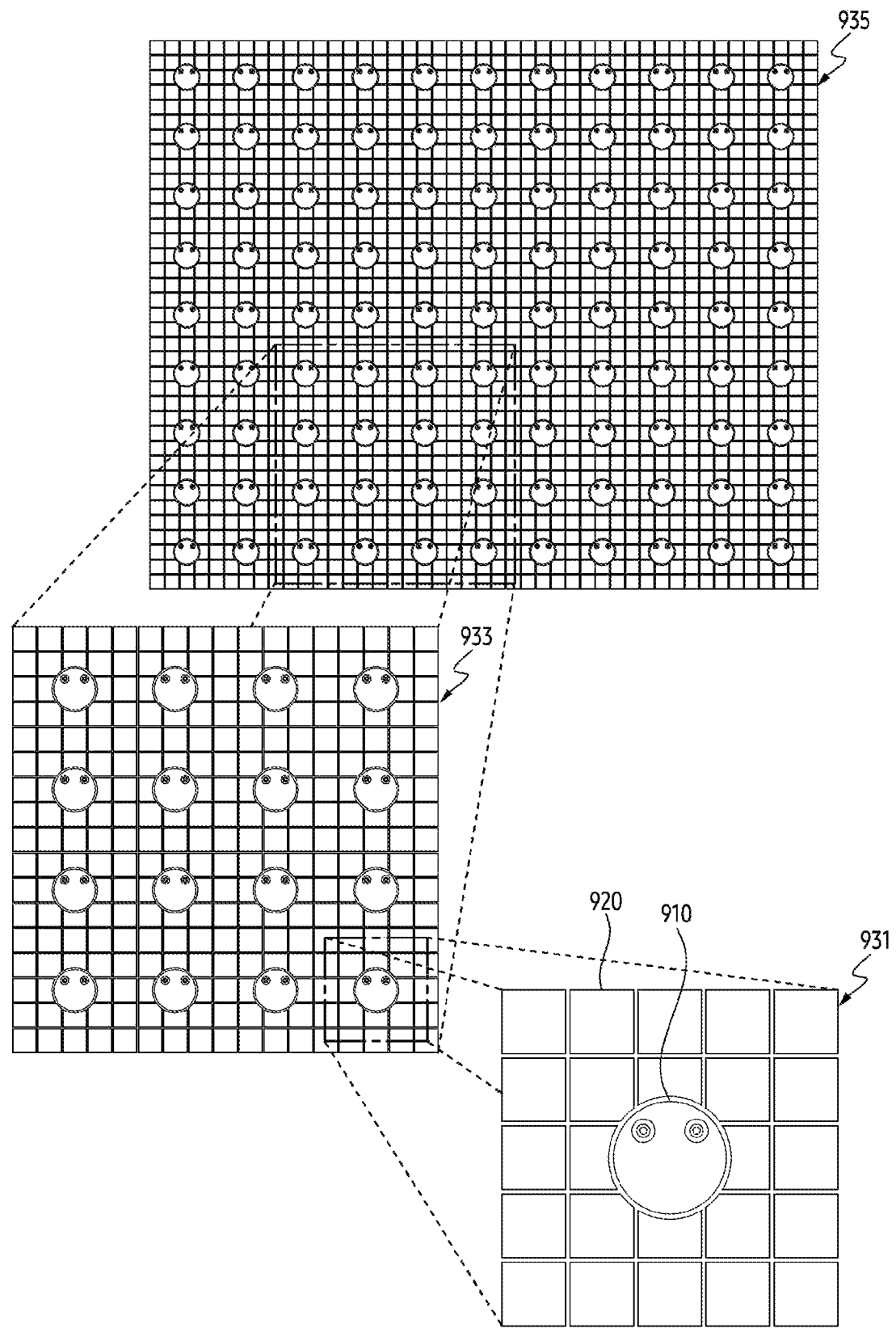
Figure 9C:
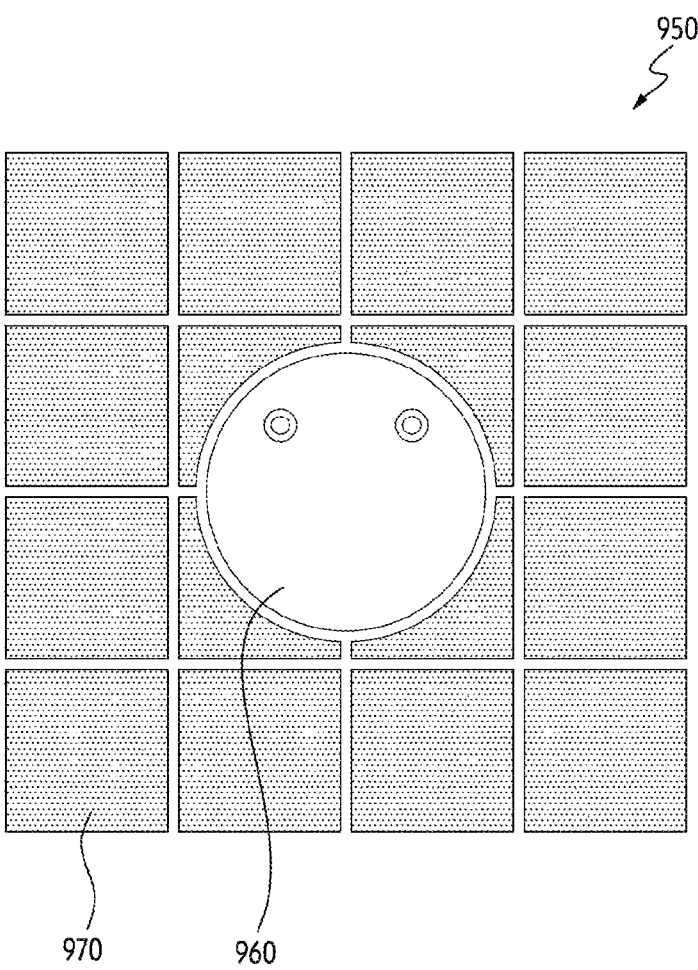

FIGS. 9A, 9B and 9C are diagrams illustrating examples of a radiation area including a radiator and a resonator according to embodiments.

Referring to FIG. 9A, a perspective view 900 of the radiation area of an antenna module (e.g., an antenna module 213) is illustrated. The radiation area may include a radiator 910 and a resonator 920.

Referring to FIG. 9B, the radiation area may include a radiation pattern 935. The radiation pattern 935 may include a plurality of resonators and a plurality of radiators. For example, the radiation pattern 933 of the antenna module may include a grid array formed in an area except for an area in which the 16 radiators are disposed, in 16 radiators and an antenna substrate (e.g., a first substrate 530, a first substrate 630, and a first substrate 730). A partial area 931 of the radiation pattern 935 may include the radiator 910 of a circular patch and the resonator 920 of a quadrangle shape.

Referring to FIG. 9C, an area 950 of the radiation pattern 935 may include a radiator 960 and a resonator 970. According to an embodiment, the resonators (e.g., the resonator 970) may be disposed to surround the radiator 960. For example, the resonators may be disposed to form the grid array around the radiator 960. According to an embodiment, among the resonators, other resonators, except for a resonator in contact with the radiator 960, may be disposed at uniform intervals.

In FIGS. 9A, 9B and 9C, the resonators disposed at uniform intervals are described, but embodiments of the present disclosure are not limited thereto. According to an embodiment, the interval between the resonators may vary depending on the degree adjacent to the radiator. For example, the interval between the first resonator relatively close to the radiator and the radiator may be formed longer than the interval between the second resonator relatively far from the radiator and the first radiator. For another example, the interval between the first resonator and the radiator may be formed shorter than the interval between the second resonator and the first radiator.

Figure 9D:
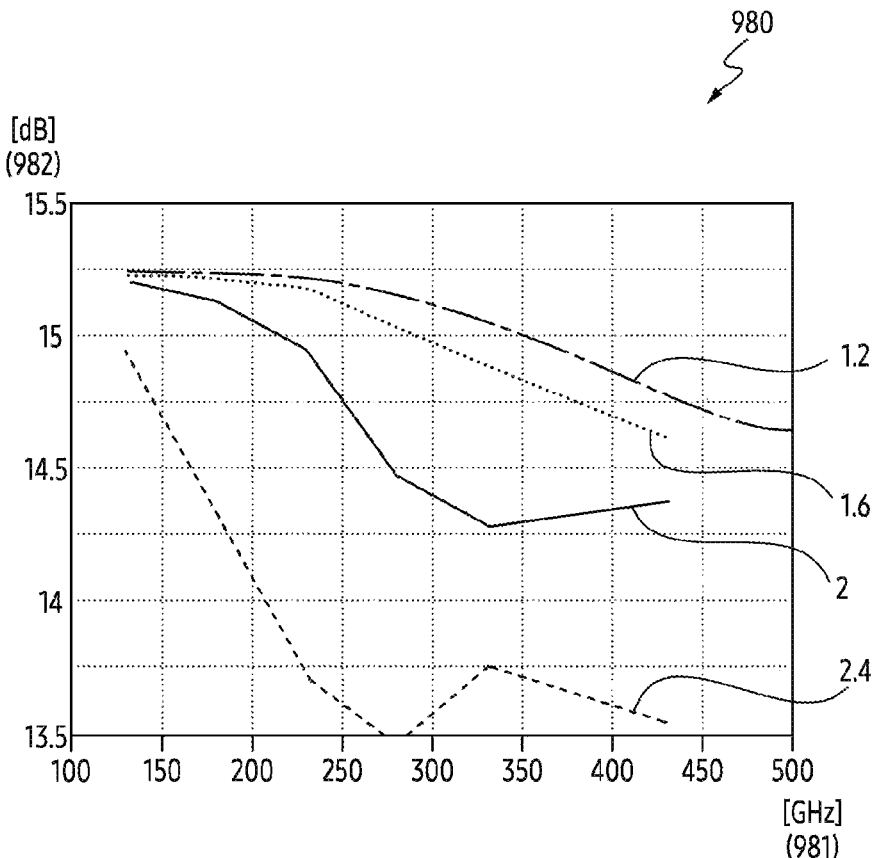
FIG. 9D is a graph illustrating an example of performance according to a size of an antenna board according to embodiments.

FIG. 9D is a graph illustrating an example of performance according to a size of an antenna board according to embodiments. The antenna board (e.g., a first substrate 530, a first substrate 630, and a first substrate 730) may include a radiator and a resonator.

A graph 980 represents a relationship between gains according to the size of the resonator. A horizontal axis 981 of the graph 980 represents a frequency (unit: GHz), and a vertical axis 982 represents a gain (unit: decibel (dB)). Lines may be distinguished based on the size of the resonator. The first line represents a gain for each frequency when the size of the resonator is about 1.2 mm. The second line represents a gain for each frequency when the size of the resonator is about 1.6 mm. The third line represents a gain for each frequency when the size of the resonator is about 2 mm. The fourth line represents a gain for each frequency when the size of the resonator is about 2.4 mm. It may be confirmed that the gain is improved as the size of the resonator is smaller.

Figure 10A:
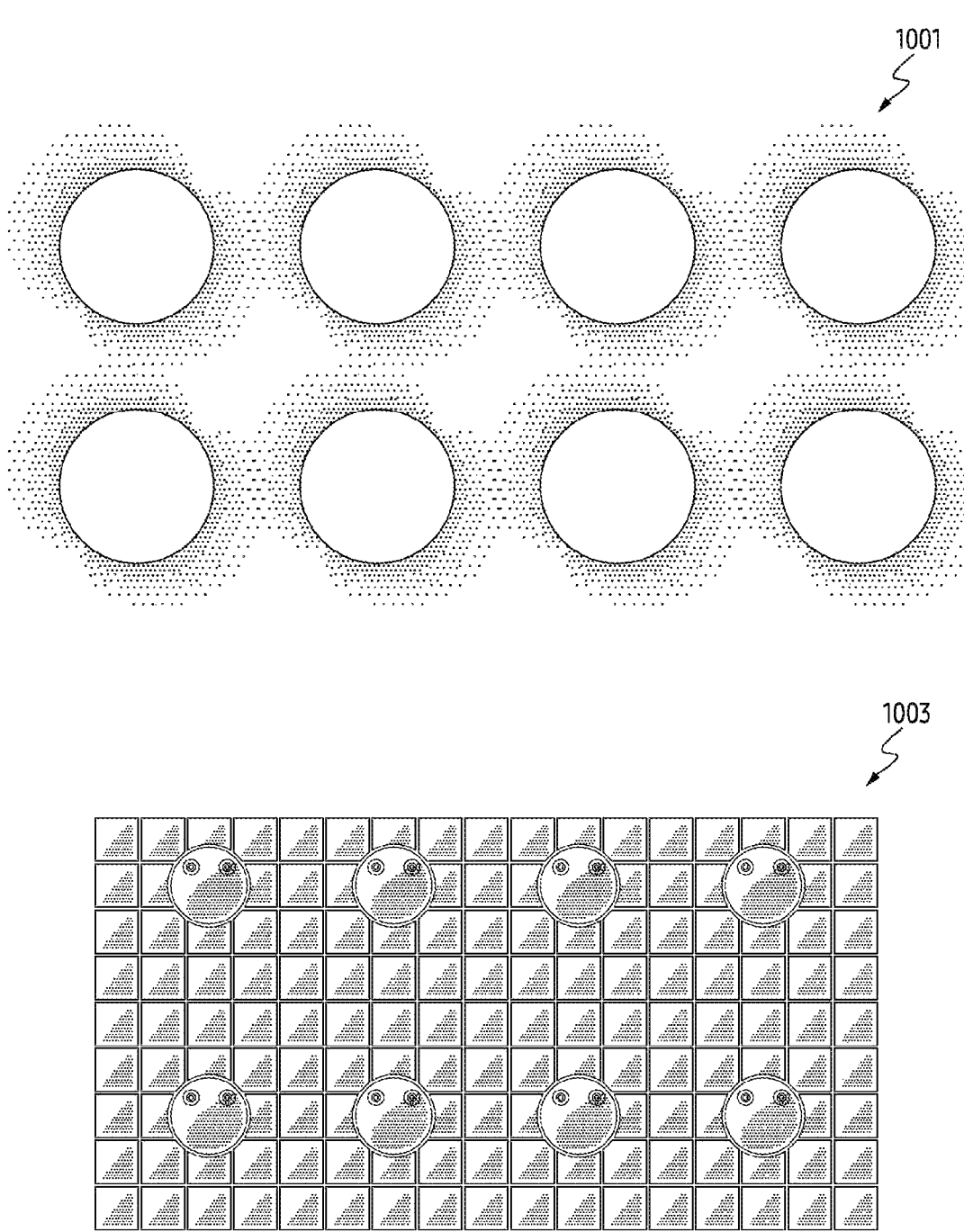
FIG. 10A is a diagram illustrating an example of radiation according to the presence or absence of a resonator according to embodiments.

FIG. 10A includes diagrams illustrating an example of radiation according to the presence or absence of a resonator according to embodiments.

Referring to FIG. 10A, a first radiation surface 1001 represents one surface of an antenna substrate including only radiators without additional resonators. A second radiation surface 1003 represents one surface of the antenna substrate (e.g., a first substrate 530, a first substrate 630, and a first substrate 730) on which additional resonators are disposed, together with the radiator. Hereinafter, indicators of performance improvement according to the presence or absence of additional resonators will be described, with reference to FIGS. 10B to 10C.

Figure 10B:
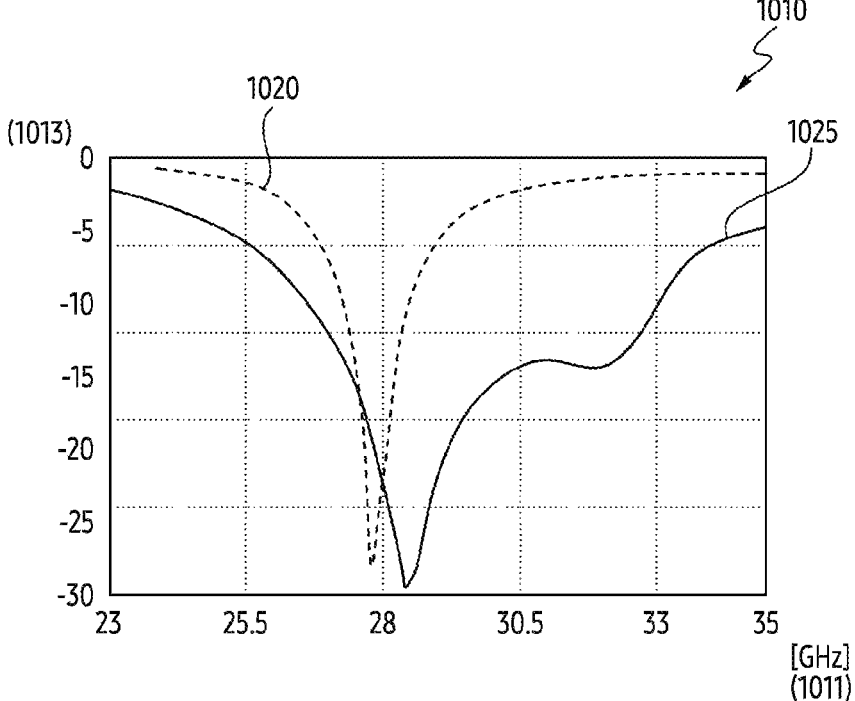
FIG. 10B is a graph illustrating an example of a reflection loss according to the presence or absence of a resonator according to embodiments.

FIG. 10B is a graph illustrating an example of a reflection loss according to the presence or absence of a resonator according to embodiments.

Referring to FIG. 10B, a graph 1010 represents the reflection loss according to a frequency. A horizontal axis 1011 of the graph 1010 represents the frequency (unit: GHz), and a vertical axis 1013 represents the reflection loss (unit: decibel (dB)). A first line 1020 represents the reflection loss according to an antenna substrate on which a metal SUS is mounted. A second line 1025 represents the reflection loss according to the antenna substrate (e.g., a first substrate 530, a first substrate 630, and a first substrate 730) including the resonator. It may be confirmed that a RU module 220 provides bandwidth expansion compared to the RU module including the existing metal SUS, through expanding the area that provides a gain of a certain size (e.g., −5 dB) or more.

Figure 10C:
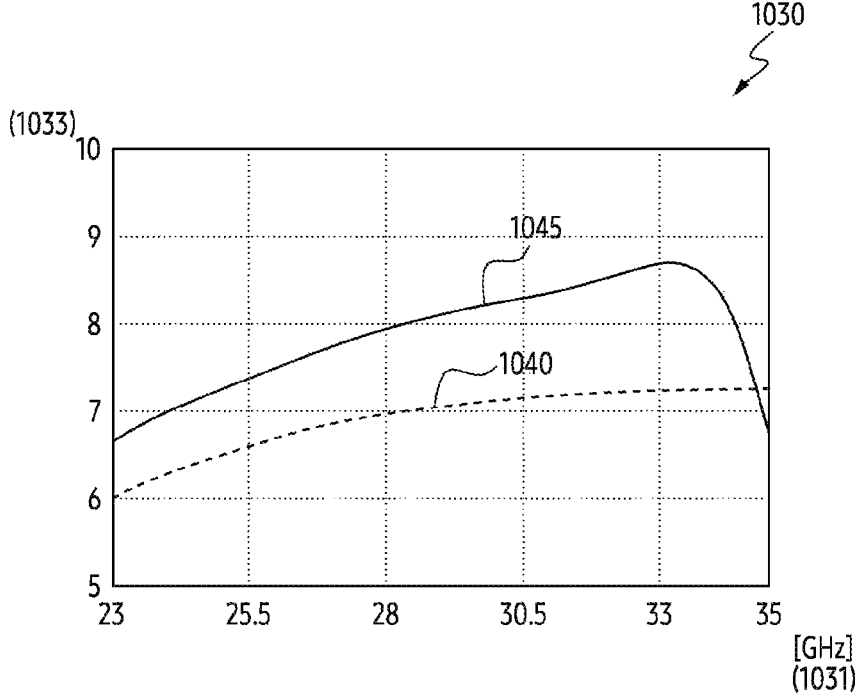
FIG. 10C is a graph illustrating an example of a gain according to the presence or absence of a resonator according to embodiments.

FIG. 10C is a graph illustrating an example of a gain according to the presence or absence of a resonator according to embodiments.

Referring to FIG. 10C, a graph 1030 represents a gain according to a frequency. A horizontal axis 1031 of the graph 1030 represents the frequency (unit: GHz), and a vertical axis 1033 represents the gain (unit: dB). A first line 1040 represents a gain according to an antenna substrate on which a metal SUS is mounted. A second line 1045 represents a gain according to the antenna substrate (e.g., a first substrate 530, a first substrate 630, and a first substrate 730) including the resonator. Through the graph 1030, it may be confirmed that the RU module 220 provides gain improvement compared to the RU module including the existing metal SUS.

Figure 11:
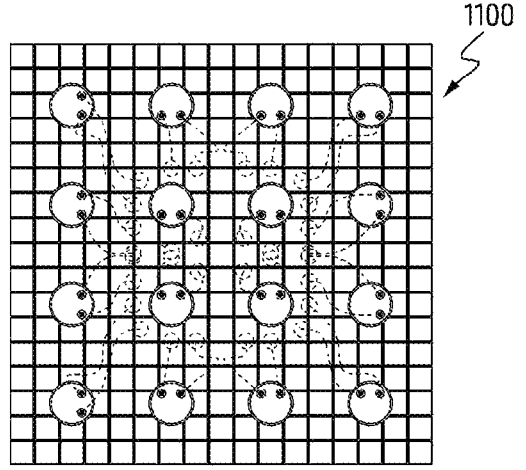
FIG. 11 includes a diagram and graphs illustrating an example of performance of a RU module including a resonator according to embodiments.
Figure 11:
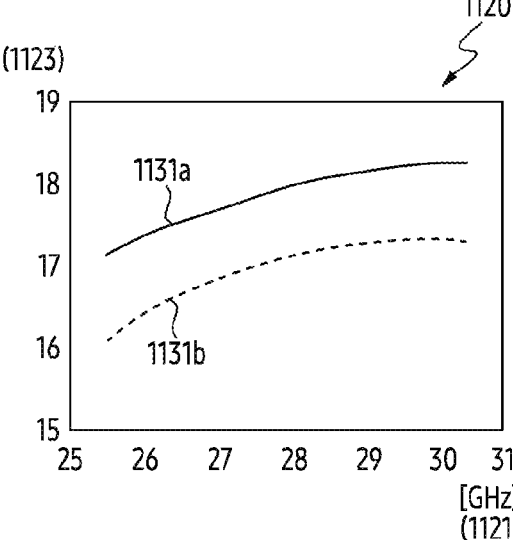
Figure 11:
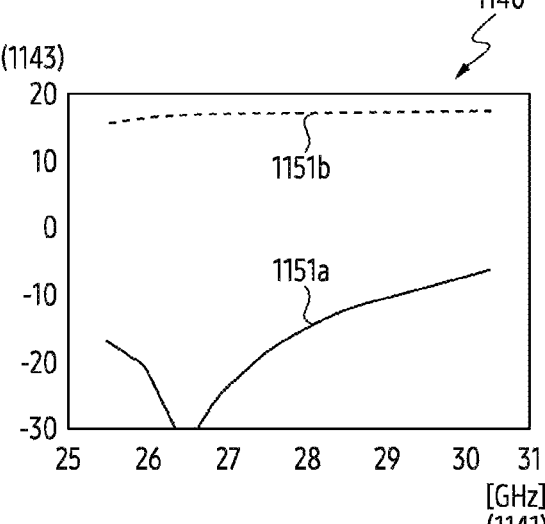

FIG. 11 includes a diagram and graphs illustrating an example of performance of a RU module including a resonator according to embodiments.

Referring to FIG. 11, an antenna module of a RU module (e.g., a RU module 220) may include a plurality of radiators and a plurality of resonators. For example, one area 1100 of the antenna module may include a grid array formed in an area except for an area on which the 16 radiators are disposed, in 16 radiators and an antenna substrate (e.g., a first substrate 530, a first substrate 630, and a first substrate 730).

A graph 1120 represents directivity and gain according to a frequency. A horizontal axis 1121 of the graph 1120 represents the frequency (unit: GHz), and a vertical axis 1123 represents the directivity or the gain (unit: dB). A first line 1131a represents the directivity. A second line 1131b represents the gain. Compared to the RU module including the existing metal SUS, the RU module 220 may provide gain improvement and high efficiency through the antenna substrate including the radiator and the resonator.

A graph 1140 represents a cross polarization ratio (CPR) performance according to the frequency. A horizontal axis 1141 of the graph 1140 represents the frequency (unit: GHz), and a vertical axis 1143 represents the gain (unit: dB). A first line 1151a represents a cross-polarization (X-pol) component, and a second line 1151b represents a co-polarization (co-pol) component. Compared to the RU module including the existing metal SUS, the RU module 220 may provide CPR improvement through the antenna substrate including the radiator and the resonator.

Figure 12:
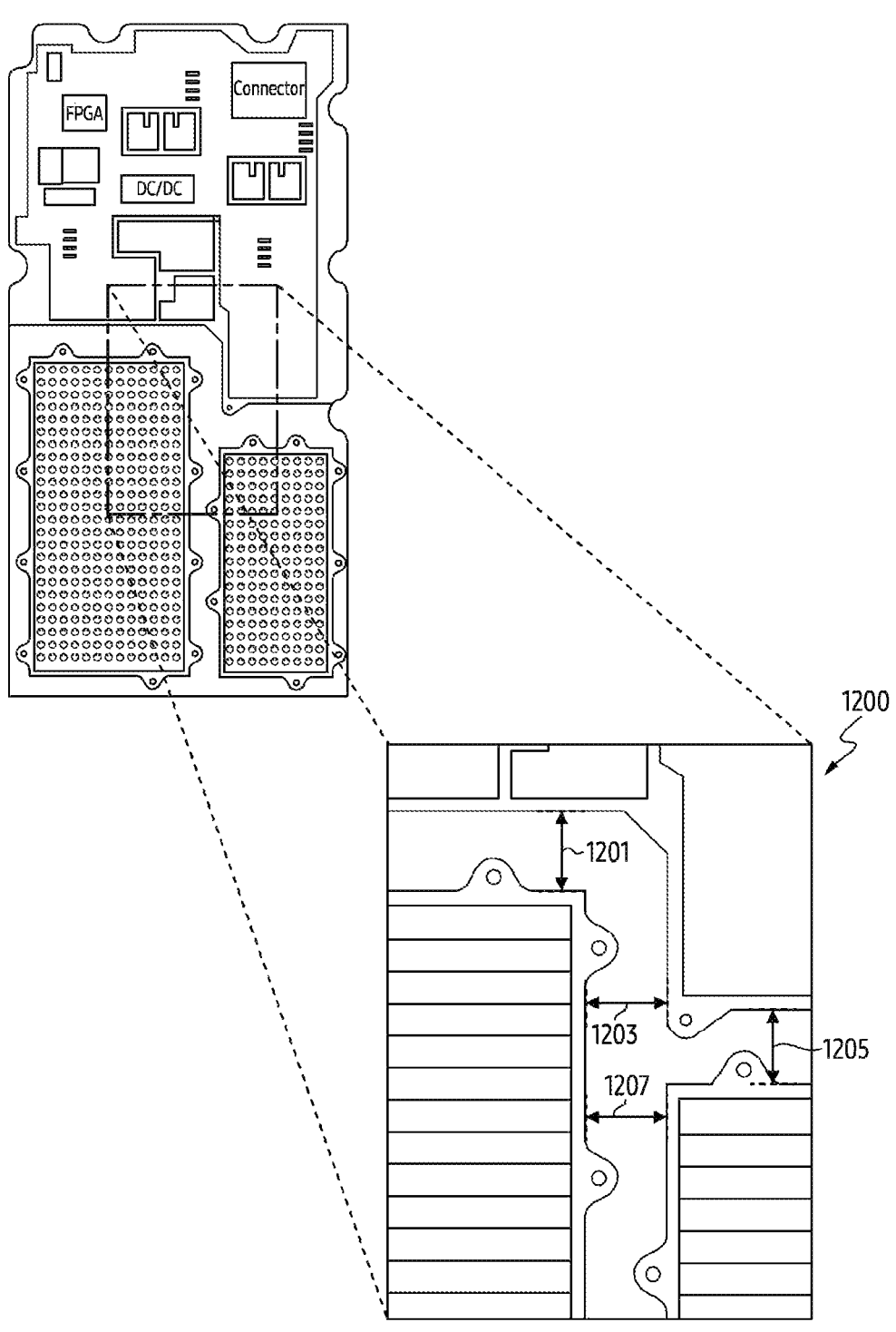
FIG. 12 is a diagram illustrating an example of a disposition of a RU module including a resonator according to embodiments.

FIG. 12 is a diagram illustrating an example of a disposition of a RU module including a resonator according to embodiments. In order to describe the disposition of the RU module (eg, a RU module 220) in FIG. 12, FIG. 4 may be referred to. Separation distances between antennas may be confirmed in one area 1200 of the RU module 220. An antenna substrate for a first frequency band (e.g., a 28 GHz band) and an antenna substrate for a second frequency band (e.g., a 39 GHz band) may be mounted together on the RU module 220. Due to problems of the assembly of existing antenna substrates and the assembly of metal pillars (e.g., metal SUS), a physical separation distance between antenna substrates equal to or greater than a reference value is required, in the design of the RU module. However, the RU module 220 according to embodiments may transmit a wireless signal, through a single substrate (e.g., a first substrate 530, a first substrate 630, a first substrate 730)

including the radiator and the resonator, without antenna design using the metal pillar and an FPCB.

Referring to FIG. 12, separation distances (e.g., a first separation distance 1201, a second separation distance 1203, a third separation distance 1205, and a fourth separation distance 1207) between antennas may be confirmed in one area 1200 of the RU module 220. Due to the reduction of the separation distances, the implementation of the antenna module design including the resonator of the present disclosure may be confirmed.

Figure 13:
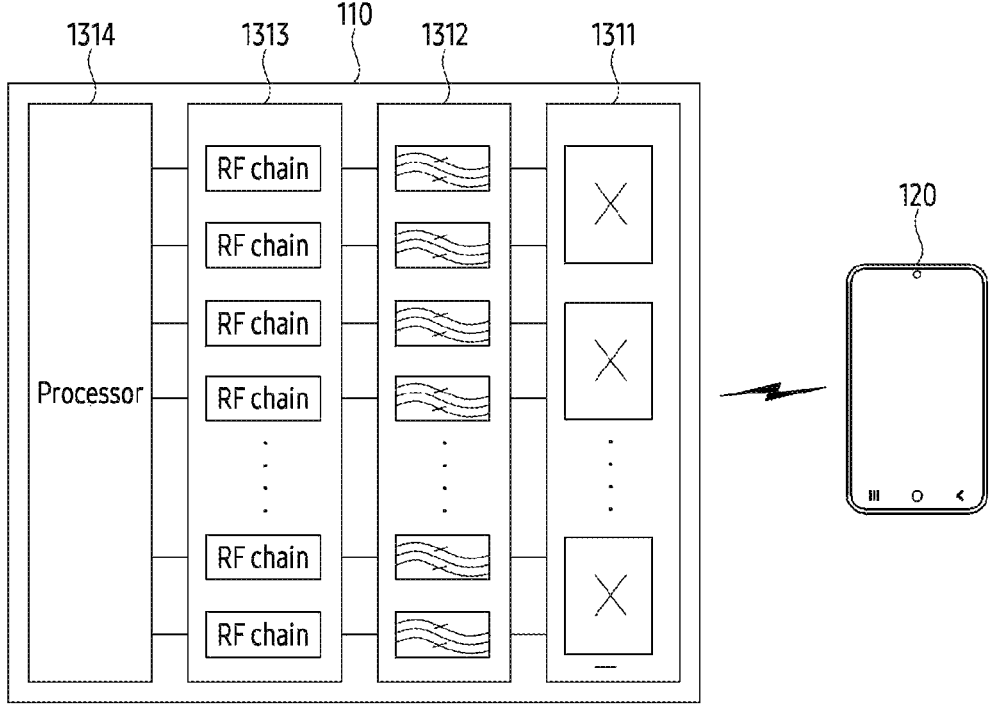
FIG. 13 is a diagram illustrating an example functional configuration of an electronic device including a RU module according to embodiments.

FIG. 13 is a diagram illustrating an example functional configuration of an electronic device including a RU module according to embodiments. A base station 110 is illustrated as the electronic device, but it goes without saying that it may also be applied to a terminal 120. According to an embodiment, the base station 110 may be a base station equipment that supports mmWave communication (e.g., Frequency Range 2 of 3GPP). Not only an antenna module itself mentioned with reference to FIGS. 1 to 12, but also the electronic device including the same is included in various embodiments of the present disclosure. The electronic device 1110 may include RF equipment in which a resonator is disposed on a layer adjacent to the radiator, to obtain an additional radiation effect.

Referring to FIG. 13, the electronic device may include an antenna unit (e.g., including at least one antenna) 1311, a power interface unit (e.g., including power interface circuitry) 1312, a radio frequency (RF) processing unit (e.g., including processing circuitry) 1313, and a control unit (e.g., including control circuitry) 1314.

The antenna unit 1311 may include multiple antennas. The antenna unit 1311 may include the antenna module. The antenna of the antenna module performs functions for transmitting and receiving a signal through a wireless channel. The antenna may include the radiator formed of a conductor or a conductive pattern formed on a substrate (e.g., a PCB, a PFCB). The antenna may radiate an up-converted signal on the wireless channel or may obtain a signal radiated by another device. Each antenna may be referred to as an antenna element or antenna device. In embodiments, the antenna unit 1311 may include an antenna array in which a plurality of antenna elements form an array. According to embodiments of the present disclosure, the antenna unit 1311 may additionally include one or more resonators in addition to the radiator corresponding to the antenna element. The one or more resonators may be disposed on or inside the substrate on which antenna elements are disposed. According to an embodiment, the one or more resonators may be disposed on the same layer as the layer on which the radiator is disposed. According to an embodiment, the one or more resonators may be disposed on the layer adjacent to the layer on which the radiator is disposed. The antenna unit 1311 may be electrically connected to the power interface unit 1312 through RF signal lines. The antenna unit 1311 may provide the received signal to the power interface unit 1312 or may radiate the signal provided from the power interface unit 1312 into the air.

The power interface unit 1312 may include a module and parts including various power interface circuitry. The power interface unit 1312 may include one or more IFs. The power interface unit 1312 may include one or more LOs. The power interface unit 1312 may include one or more LDOs. The power interface unit 1312 may include one or more DC/DC converters. The power interface unit 1312 may include one or more DFEs. The power interface unit 1312 may include one or more FPGAs. The power interface unit 1312 may include one or more connectors. The power interface unit 1312 may include a power supply.

According to an embodiment, the power interface unit 1312 may include areas for mounting one or more antenna modules. For example, the power interface unit 1312 may include a plurality of antenna modules, to support MIMO communication. The antenna module according to the antenna unit 1311 may be mounted in a corresponding area. According to an embodiment, the power interface unit 1312 may include a filter. The filter may perform filtering, to transmit a signal of a desired frequency. The power interface unit 1312 may include the filter. The filter may perform a function for selectively identifying a frequency by forming a resonance. The power interface unit 1312 may include at least one of a band pass filter, a low pass filter, a high pass filter, or a band reject filter. In other words, the power interface unit 1312 may include RF circuits for obtaining a signal of a frequency band for transmission or a frequency band for reception. The power interface unit 1312 according to various embodiments may electrically connect the antenna unit 1311 and the RF processing unit 1313.

The RF processing unit 1313 may include a plurality of RF processing chains including various processing circuitry. The RF chain may include a plurality of RF elements. The RF elements may include an amplifier, a mixer, an oscillator, a DAC, an ADC, and the like. According to an embodiment, the RF processing chain may be implemented as an RFIC. For example, the RF processing unit 1313 may include an up converter that up-converts a digital transmission signal of a base band into a transmission frequency, and a digital-to-analog converter (DAC) that converts the up-converted digital transmission signal into an analog RF transmission signal. The up converter and the DAC form a portion of the transmission path. The transmission path may further include a power amplifier (PA) or a coupler (or a combiner). For example, the RF processing unit 1313 may include an analog-to-digital converter (ADC) that converts an analog RF reception signal into a digital reception signal and a down converter that converts the digital reception signal into the digital reception signal of the baseband. The ADC and the down converter form a portion of the reception path. The reception path may further include a low-noise amplifier (LNA) or the coupler (or a divider). RF parts of the RF processing unit may be implemented on the PCB. The base station 110 may include a structure stacked in the order of the antenna unit 1311—the power interface unit 1312—the RF processing unit 1313. For example, as illustrated in FIG. 5A, a first substrate 530, a second substrate 510, and a RFA 515 may be sequentially stacked. The antennas, the RF parts of the power interface unit, and the RFICs may be implemented on a separate the PCB, and the filters may be repeatedly fastened between the PCB and the PCB to form multiple layers, in the scope of not departing from the technical principles of the various embodiments of the present disclosure.

The control unit 1314 may include various processing and/or control circuitry and control overall operations of the electronic device. The control unit 1314 may include various modules for performing communication. The control unit 1314 may include at least one processor such as a modem. The control unit 1314 may include modules for digital signal processing. For example, the control unit 1314 may include the modem. When transmitting data, the control unit 1314 generates complex symbols by encoding and modulating a transmission bit string. For example, when receiving data, the control unit 1314 restores the received bit string by demodulating and decoding the baseband signal. The control unit 1314 may perform functions of a protocol stack required by a communication standard.

In FIG. 13, a functional configuration of the electronic device has been described as an equipment in which the antenna module of the present disclosure may be utilized. However, the example illustrated in FIG. 13 is merely an example configuration for utilizing the antenna module including the radiator and the resonator according to the various embodiments of the present disclosure described with reference to FIGS. 1 to 12, and the various embodiments of the present disclosure are not limited to the components of the equipment illustrated in FIG. 13. Accordingly, other antenna equipment including the radiator and the resonator, communication equipment of different configuration, and antenna structure itself may also be understood as being included in the various embodiments of the present disclosure.

In various example embodiments, a module for a wireless communication may comprise: a radiator, a plurality of resonators, a first substrate on which the radiator and the plurality of resonators are disposed, and a second substrate including a power supply. The first substrate may include a plurality of first layers. The second substrate may include a plurality of second layers. The radiator may be disposed on a radiation layer of the plurality of first layers of the first substrate. The plurality of resonators may be disposed on a resonance layer of the plurality of first layers of the first substrate. At least part of the plurality of resonators in the resonance layer may be disposed in an area in the radiation layer, distinct (e.g., not overlapped) from an area in which the radiator is disposed.

According to an example embodiment, the first substrate may comprise a printed circuit board (PCB). The first substrate and the second substrate may be electrically connected through a ball grid array (BGA).

According to an example embodiment, the resonance layer on which the plurality of resonators of the first substrate are disposed may be different from the radiation layer on which the radiator of the first substrate is disposed.

According to an example embodiment, the plurality of resonators may be disposed at uniform intervals in the resonant layer of the first substrate.

According to an example embodiment, the plurality of resonators may be disposed to form a grid array in an area different from an area on which the radiator is disposed, in an area of the resonance layer.

According to an example embodiment, the plurality of resonators may include a first resonator and a second resonator. A distance between the radiator and the first resonator may be longer than a distance between the radiator and the second resonator. A size of the first resonator may be greater than a size of the second resonator.

According to an example embodiment, the module may further comprise a plurality of additional resonators. A layer on which the plurality of additional resonators is disposed among the plurality of first layers of the first substrate may be different from the resonance layer.

According to an example embodiment, the first substrate may comprise a feedline configured to supply a signal received from the second substrate to a radiator.

The feedline may be disposed on a feeding layer among the plurality of first layers of the first substrate. The feeding layer may be disposed closer to the second substrate than the radiation layer and the resonance layer.

According to an example embodiment, the second substrate may be electrically connected to a radio frequency (RF) module comprising a radio frequency integrated circuit (RFIC). The second substrate may comprise a via hole and a feedline configured to transfer a signal received from the RF module to the first substrate. The via hole may be formed over at least a portion of the plurality of second layers of the second substrate.

According to an example embodiment, the first substrate may comprise a flexible printed circuit board (FPCB). The first substrate may be electrically connected through an adhesive. The resonance layer on which the plurality of resonators of the first substrate is disposed may be a same layer as the radiation layer on which the radiator of the first substrate is disposed. The first substrate may comprise a plurality of radiators. The plurality of resonators may be disposed to form a gird array in an area different from an area on which the plurality of radiators is disposed in the first substrate.

In various example embodiments, an electronic device in a wireless communication system, may comprise: a radome cover, a radio unit (RU) housing, and a RU module. The RU module may comprise an RU board comprising an antenna board on which antenna modules are disposed and a power supply. An antenna module of the antenna modules may comprise a plurality of radiators, a plurality of resonators, and an antenna board on which the radiator and the plurality of resonators are disposed. The antenna board may include a plurality of first layers. The RU board may include a plurality of second layers. The radiator may be disposed on a radiation layer of the plurality of first layers of the antenna board. The plurality of resonators may be disposed on a resonance layer of the plurality of first layers of the antenna board. At least part of the plurality of resonators in the resonance layer may be disposed in an area in the radiation layer, distinct (e.g., not overlapped) from an area in which the radiator is disposed.

According to an example embodiment, the antenna board may comprise a printed circuit board (PCB). The antenna board and the RU board may be electrically connected through a ball grid array (BGA).

According to an example embodiment, the resonance layer on which the plurality of resonators of the antenna board are disposed may be different from the radiation layer on which the radiator of the antenna board is disposed.

According to an example embodiment, the plurality of resonators may be disposed at uniform intervals in the resonant layer of the antenna board.

According to an example embodiment, the plurality of resonators may be disposed to form a grid array in an area different from an area on which the plurality of radiator is disposed, in an area of the resonance layer.

According to an example embodiment, the plurality of resonators may include a first resonator and a second resonator. A distance between the radiator and the first resonator may be longer than a distance between the radiator and the second resonator. A size of the first resonator may be greater than a size of the second resonator.

According to an example embodiment, the antenna module may further comprise a plurality of additional resonators. A layer on which the plurality of additional resonators is disposed among the plurality of first layers of the antenna board may be different from the resonance layer.

According to an example embodiment, the antenna board may comprise a feedline configured to supply a signal received from the RU board to a radiator. The feedline may be disposed on a feeding layer among the plurality of first layers of the antenna board. The feeding layer may be disposed closer to the RU board than the radiation layer and the resonance layer.

According to an example embodiment, the RU board may be electrically connected to a radio frequency (RF) module (or an RF device) comprising a radio frequency integrated circuit (RFIC). The RU board may comprise a via hole and a feedline configured to transfer a signal received from the RF module to the antenna board. The via hole may be formed over at least a portion of the plurality of second layers of the RU board.

According to an example embodiment, the antenna board may comprise a flexible printed circuit board (FPCB). The antenna board may be electrically connected through an adhesive. The resonance layer on which the plurality of resonators of the antenna board is disposed may be the same layer as the radiation layer on which the radiator of the antenna board is disposed. The antenna board may comprise a plurality of radiators. The plurality of resonators may be disposed to form a grid array in an area different from an area on which the plurality of radiators is disposed in the antenna board.

Methods according to the various example embodiments described in the disclosure may be implemented in the form of hardware, software, or a combination of hardware and software.

When implemented as software, a non-transitory computer-readable storage medium storing one or more program (software module) may be provided. The one or more program stored in the computer-readable storage medium is configured for execution by one or more processor in the electronic device. The one or more program include instructions that cause the electronic device to execute methods according to embodiments described in the present disclosure.

Such program (software modules, software) may be stored in random access memory, non-volatile memory including flash memory, read only memory (ROM), electrically erasable programmable read only memory (EE-PROM), magnetic disc storage device, compact disc-ROM (CD-ROM), digital versatile disc (DVD) or other form of optical storage, magnetic cassette. Alternatively, it may be stored in a memory configured with some or all combinations thereof. Each configuration memory may be included a plurality.

The program may be stored in an attachable storage device that may be accessed through a communication network, such as the Internet, Intranet, local area network (LAN), wide area network (WAN), or storage area network (SAN), or a combination thereof. Such a storage device may be connected to a device performing an embodiment of the present disclosure through an external port. A separate storage device on the communication network may access a device performing an embodiment of the present disclosure.

In the above-described example embodiments of the present disclosure, components included in the disclosure are expressed in singular or plural according to the presented example embodiment. However, singular or plural expression is chosen appropriately for the situation presented for convenience of explanation, and the present disclosure is not limited to singular or plural component, and even if the component is expressed in plural, it may be configured with singular, or even if it is expressed in singular, it may be configured with plural.

While the disclosure has been illustrated and described with reference to various example embodiments, it will be understood that the various example embodiments are intended to be illustrative, not limiting. It will be further understood by those skilled in the art that various changes in form and detail may be made without departing from full scope of the disclosure, including the appended claims and their equivalents. It will also be understood that any of the embodiment(s) described herein may be used in conjunction with any other embodiment(s) described herein.

What is claimed is:

1. A module for a wireless communication, comprising:
a radiator;
a plurality of resonators;
a first substrate on which the radiator and the plurality of resonators are disposed; and
a second substrate including a power supply,
wherein the first substrate includes a plurality of first layers,
wherein the second substrate includes a plurality of second layers,
wherein the radiator is disposed on a radiation layer of the plurality of first layers of the first substrate,
wherein the plurality of resonators is disposed on a resonance layer of the plurality of first layers of the first substrate,
wherein at least part of the plurality of resonators in the resonance layer is disposed over an area in the radiation layer, distinct from an area in which the radiator is disposed,
wherein the first substrate comprises a feedline disposed on a feeding layer among the plurality of first layers of the first substrate, and
wherein the feeding layer is disposed closer to the second substrate than the radiation layer and the resonance layer.

2. The module of claim 1,
wherein the first substrate comprises a printed circuit board (PCB), and
wherein the first substrate and the second substrate are electrically connected through a ball grid array (BGA).

3. The module of claim 1,
wherein the resonance layer on which the plurality of resonators of the first substrate are disposed is different from the radiation layer on which the radiator of the first substrate is disposed.

4. The module of claim 1,
wherein the plurality of resonators are disposed at uniform intervals in the resonant layer of the first substrate.

5. The module of claim 1,
wherein the plurality of resonators are arranged such that a grid array is formed in an area, which is different from an area on which the radiator is disposed, in an area of the resonance layer.

6. The module of claim 1,
wherein the plurality of resonators includes a first resonator and a second resonator,
wherein a distance between the radiator and the first resonator is longer than a distance between the radiator and the second resonator, and
wherein a size of the first resonator is larger than a size of the second resonator.

7. The module of claim 1, further comprising:
a plurality of additional resonators,
wherein a layer on which the plurality of additional resonators is disposed among the plurality of first layers of the first substrate is different from the resonance layer.

8. The module of claim 1,
wherein the second substrate is electrically connected to a radio frequency (RF) module comprising a radio frequency integrated circuit (RFIC),

wherein the second substrate comprises a via hole and a feedline for transferring a signal received from the RF module to the first substrate,
wherein the via hole is formed over at least a portion of the plurality of second layers of the second substrate.

9. The module of claim 1,
wherein the first substrate comprises a flexible printed circuit board (FPCB),
wherein the first substrate is electrically connected through an adhesive,
wherein the resonance layer on which the plurality of resonators of the first substrate is disposed is same as the radiation layer on which the radiator of the first substrate is disposed,
wherein the first substrate comprises a plurality of radiators, and
wherein the plurality of resonators is disposed to form a grid array in an area different from an area on which the plurality of radiators is disposed in the first substrate.

10. An electronic device in a wireless communication system, comprising:
a radome cover;
a radio unit (RU) housing; and
a RU module,
wherein the RU module comprises an antenna board on which antenna modules are disposed and a RU board comprising a power supply,
wherein an antenna module of the antenna modules comprises:
a radiator;
a plurality of resonators; and
an antenna board on which the radiator and the plurality of resonators are disposed; and
wherein the antenna board includes a plurality of first layers,
wherein the RU board includes a plurality of second layers,
wherein the radiator is disposed on a radiation layer of the plurality of first layers of the antenna board,
wherein the plurality of resonators is disposed on a resonance layer of the plurality of first layers of the antenna board,
wherein at least part of the plurality of resonators in the resonance layer is disposed over an area in the radiation layer, distinct from an area in which the radiator is disposed,
wherein the antenna board comprises a feedline disposed on a feeding layer among the plurality of first layers of the antenna board, and
wherein the feeding layer is disposed closer to the RU board than the radiation layer and the resonance layer.

11. The electronic device of claim 10,
wherein the antenna board comprises a printed circuit board (PCB), and
wherein the antenna board and the RU board are electrically connected through a ball grid array (BGA).

12. The electronic device of claim 10,
wherein the resonance layer on which the plurality of resonators of the antenna board are disposed is different from the radiation layer on which the radiator of the antenna board is disposed.

13. The electronic device of claim 10,
wherein the plurality of resonators are arranged at uniform intervals in the resonant layer of the antenna board.

14. The electronic device of claim 10, wherein the plurality of resonators are arranged such that a grid array is formed in an area, which is different from an area on which the radiator is disposed, in an area of the resonance layer.

15. The electronic device of claim 10, wherein the plurality of resonators includes a first resonator and a second resonator, wherein a distance between the radiator and the first resonator is longer than a distance between the radiator and the second resonator, and wherein a size of the first resonator is larger than a size of the second resonator.

16. The electronic device of claim 10, further comprising:

a plurality of additional resonators, wherein a layer on which the plurality of additional resonators is disposed among the plurality of first layers of the antenna board is different from the resonance layer.

17. The electronic device of claim 10, wherein the RU board is electrically connected to a radio frequency (RF) module comprising a radio frequency integrated circuit (RFIC), wherein the RU board comprises a via hole and a feedline for transferring a signal received from the RF module to the antenna board, wherein the via hole is formed over at least a portion of the plurality of second layers of the RU board.

18. The electronic device of claim 10, wherein the antenna board comprises a flexible printed circuit board (FPCB), wherein the antenna board is electrically connected through an adhesive, wherein the resonance layer on which the plurality of resonators of the antenna board is disposed is same as the radiation layer on which the radiator of the antenna board is disposed, wherein the antenna board comprises a plurality of radiators, and wherein the plurality of resonators is disposed to form a grid array in an area different from an area on which the radiator is disposed in the antenna board.

* * * * *